(12) United States Patent
Ni et al.

(10) Patent No.: US 8,998,620 B2
(45) Date of Patent: Apr. 7, 2015

(54) MOLDING METHOD FOR COB-EUSB DEVICES AND METAL HOUSING PACKAGE

(71) Applicant: Super Talent Technology, Corp., San Jose, CA (US)

(72) Inventors: Jim Chin-Nan Ni, San Jose, CA (US); Nan Nan, San Jose, CA (US); Abraham C. Ma, Fremont, CA (US)

(73) Assignee: Super Talent Technology, Corp., San Jose, CA (US)

( * ) Notice: Subject to any disclaimer, the term of this patent is extended or adjusted under 35 U.S.C. 154(b) by 260 days.

(21) Appl. No.: 13/786,412

(22) Filed: Mar. 5, 2013

(65) Prior Publication Data

US 2013/0183862 A1 Jul. 18, 2013

Related U.S. Application Data

(60) Continuation-in-part of application No. 13/274,188, filed on Oct. 14, 2011, now Pat. No. 8,567,050, which is a division of application No. 12/234,581, filed on Sep. 19, 2008, now Pat. No. 8,102,657, which is a (Continued)

(51) Int. Cl.
*H01R 12/00* (2006.01)
*H05K 1/14* (2006.01)

(Continued)

(52) U.S. Cl.
CPC ................ *H01R 12/71* (2013.01); *H05K 3/361* (2013.01); *G06F 1/1632* (2013.01); *H01L 24/97* (2013.01); *H01R 12/57* (2013.01); *H05K 1/117* (2013.01); *H05K 3/0052* (2013.01); *H05K 3/284* (2013.01); *H05K 3/326* (2013.01); *H05K 3/4046* (2013.01); *H05K 5/0278* (2013.01);

(Continued)

(58) Field of Classification Search
CPC ..... H05K 5/0269; H05K 3/284; H05K 1/117; H01L 2924/01078
USPC ......... 361/737, 748, 761, 752, 730, 727, 715, 361/800; 439/55, 76.1, 660
See application file for complete search history.

(56) References Cited

U.S. PATENT DOCUMENTS 4,671,587 A * 6/1987 Lerner et al. .................. 439/142
5,385,479 A * 1/1995 Okada ........................... 439/144

(Continued)

OTHER PUBLICATIONS

USB FlashCard "Main Body Dimensions", "Top View", "Bottom View" Web pages, Lexar, 2004, 3 pages.

(Continued)

*Primary Examiner* — David Angwin
(74) *Attorney, Agent, or Firm* — Bever, Hoffman & Harms, LLP

(57) ABSTRACT

A dual-personality extended USB (EUSB) system supports both USB and EUSB devices using an extended 9-pin EUSB socket. Each EUSB device includes a PCBA having four standard USB metal contact pads, and several extended purpose contact springs disposed on an upper side of a PCB. A single-shot molding process is used to form a molded housing over passive components and IC dies disposed on the lower PCB surface. The passive components are mounted using SMT methods, and the IC dies are mounted using COB methods. The extended 9-pin EUSB socket includes standard USB contacts and extended use contacts that communicate with the PCBA through the standard USB metal contacts and the contact springs. The EUSB device is optionally used as a modular insert that is mounted onto a metal or plastic case to provide a EUSB assembly having a plug shell similar to a standard USB male connector.

12 Claims, 26 Drawing Sheets

Related U.S. Application Data continuation-in-part of application No. 11/773,830, filed on Jul. 5, 2007, now Pat. No. 7,872,871, which is a continuation-in-part of application No. 11/309,594, filed on Aug. 28, 2006, now Pat. No. 7,383,362, which is a continuation-in-part of application No. 10/707,277, filed on Dec. 2, 2003, now Pat. No. 7,103,684.

(51) Int. Cl.

| | | |
|---|---|---|
| *H05K 1/00* | (2006.01) | |
| *H05K 1/18* | (2006.01) | |
| *H01R 24/00* | (2011.01) | |
| *H01R 33/00* | (2006.01) | |
| *H01R 12/71* | (2011.01) | |
| *H05K 3/36* | (2006.01) | |
| *G06F 1/16* | (2006.01) | |
| *H01L 23/00* | (2006.01) | |
| *H01R 12/57* | (2011.01) | |
| *H05K 1/11* | (2006.01) | |
| *H05K 3/28* | (2006.01) | |
| *H05K 3/32* | (2006.01) | |
| *H05K 3/40* | (2006.01) | |
| *H05K 5/02* | (2006.01) | |
| *H05K 3/00* | (2006.01) | |
| *H01L 23/31* | (2006.01) | |

(52) U.S. Cl.
CPC .......... *H01L 2224/48091* (2013.01); *H01L 2224/48227* (2013.01); *H01L 2224/97* (2013.01); *H01L 2924/01005* (2013.01); *H01L 2924/01006* (2013.01); *H01L 2924/01033* (2013.01); *H01L 2924/01077* (2013.01); *H01L 2924/01079* (2013.01); *H01L 2924/01082* (2013.01); *H01L 2924/014* (2013.01); *H01L 2924/14* (2013.01); *H01L 2924/19041* (2013.01); *H05K 2201/0311* (2013.01); *H05K 2201/09472* (2013.01); *H05K 2203/1316* (2013.01); *H01L 2224/32145* (2013.01); *H01L 2224/32225* (2013.01); *H01L 2224/73265* (2013.01); *H01L 2224/49175* (2013.01); *H01L 24/48* (2013.01); *H01L 24/49* (2013.01); *H01L 2224/48465* (2013.01); *H01L 2924/00014* (2013.01); *H01L 2924/12041* (2013.01); *H01L 23/3121* (2013.01); *H01L 24/32* (2013.01); *H01L 24/73* (2013.01); *H01L 2223/5442* (2013.01); *H01L 2924/19105* (2013.01)

(56) References Cited

U.S. PATENT DOCUMENTS

| | | | | |
|---|---|---|---|---|
| 5,397,857 | A * | 3/1995 | Farquhar et al. | 174/520 |
| 5,404,485 | A * | 4/1995 | Ban | 711/202 |
| 5,414,597 | A * | 5/1995 | Lindland et al. | 361/816 |
| 5,430,859 | A * | 7/1995 | Norman et al. | 711/103 |
| 5,479,638 | A * | 12/1995 | Assar et al. | 711/103 |
| 5,530,622 | A * | 6/1996 | Takiar et al. | 361/737 |
| 5,563,769 | A * | 10/1996 | MacGregor | 361/737 |
| 5,623,552 | A * | 4/1997 | Lane | 382/124 |
| 5,725,395 | A * | 3/1998 | Lee | 439/607.48 |
| 5,754,397 | A * | 5/1998 | Howell et al. | 361/679.44 |
| 5,821,614 | A * | 10/1998 | Hashimoto et al. | 257/679 |
| 5,835,760 | A * | 11/1998 | Harmer | 713/2 |
| 5,891,483 | A * | 4/1999 | Miyajima | 425/89 |
| 5,941,733 | A * | 8/1999 | Lai | 439/607.01 |
| 5,959,541 | A * | 9/1999 | DiMaria et al. | 340/5.52 |
| 5,959,845 | A * | 9/1999 | Faucher | 361/777 |
| 6,000,006 | A * | 12/1999 | Bruce et al. | 711/103 |
| 6,012,636 | A * | 1/2000 | Smith | 235/380 |
| 6,027,375 | A * | 2/2000 | Wu | 439/607.02 |
| 6,036,549 | A * | 3/2000 | Wulff | 439/660 |
| 6,040,622 | A * | 3/2000 | Wallace | 257/679 |
| 6,044,428 | A * | 3/2000 | Rayabhari | 710/305 |
| 6,069,920 | A * | 5/2000 | Schulz et al. | 375/242 |
| 6,102,743 | A * | 8/2000 | Haffenden et al. | 439/630 |
| 6,116,962 | A * | 9/2000 | Laity | 439/676 |
| 6,125,192 | A * | 9/2000 | Bjorn et al. | 382/124 |
| 6,148,354 | A * | 11/2000 | Ban et al. | 710/301 |
| 6,165,016 | A * | 12/2000 | Lai | 439/607.41 |
| 6,166,913 | A * | 12/2000 | Fun et al. | 361/737 |
| 6,193,152 | B1 * | 2/2001 | Fernando et al. | 235/380 |
| 6,231,363 | B1 * | 5/2001 | Kosmala | 439/260 |
| 6,241,534 | B1 * | 6/2001 | Neer et al. | 439/76.1 |
| D445,096 | S | 7/2001 | Wallace | |
| 6,278,822 | B1 * | 8/2001 | Dawnay | 385/50 |
| 6,292,863 | B1 * | 9/2001 | Terasaki et al. | 710/313 |
| 6,297,448 | B1 * | 10/2001 | Hara | 174/559 |
| 6,313,400 | B1 * | 11/2001 | Mosquera et al. | 174/363 |
| 6,315,582 | B1 * | 11/2001 | Nishio et al. | 439/131 |
| 6,315,609 | B1 * | 11/2001 | Chung | 439/607.01 |
| 6,321,478 | B1 * | 11/2001 | Klebes | 42/84 |
| D452,690 | S | 1/2002 | Wallace et al. | |
| D452,865 | S | 1/2002 | Wallace et al. | |
| 6,334,793 | B1 * | 1/2002 | Amoni et al. | 439/680 |
| D453,934 | S | 2/2002 | Wallace et al. | |
| 6,381,143 | B1 * | 4/2002 | Nakamura | 361/737 |
| 6,385,677 | B1 * | 5/2002 | Yao | 711/115 |
| 6,399,906 | B1 * | 6/2002 | Sato et al. | 200/61.59 |
| 6,410,355 | B1 | 6/2002 | Wallace | |
| 6,438,638 | B1 * | 8/2002 | Jones et al. | 710/301 |
| 6,439,464 | B1 * | 8/2002 | Fruhauf et al. | 235/492 |
| 6,444,501 | B1 * | 9/2002 | Bolken | 438/127 |
| 6,462,273 | B1 * | 10/2002 | Corisis et al. | 174/521 |
| 6,462,953 | B2 * | 10/2002 | Tong et al. | 361/732 |
| 6,475,830 | B1 * | 11/2002 | Brillhart | 438/109 |
| 6,490,163 | B1 * | 12/2002 | Pua et al. | 361/737 |
| 6,527,188 | B1 * | 3/2003 | Shobara et al. | 235/486 |
| 6,533,612 | B1 * | 3/2003 | Lee et al. | 439/564 |
| 6,561,421 | B1 * | 5/2003 | Yu | 235/451 |
| 6,567,273 | B1 * | 5/2003 | Liu et al. | 361/737 |
| 6,570,825 | B2 * | 5/2003 | Miranda et al. | 361/728 |
| 6,573,567 | B1 * | 6/2003 | Nishizawa et al. | 257/358 |
| 6,580,615 | B1 * | 6/2003 | Nakanishi et al. | 361/737 |
| 6,615,404 | B1 * | 9/2003 | Garfunkel et al. | 717/173 |
| 6,618,243 | B1 * | 9/2003 | Tirosh | 361/679.56 |
| 6,624,005 | B1 * | 9/2003 | DiCaprio et al. | 438/113 |
| 6,629,181 | B1 * | 9/2003 | Alappat et al. | 710/300 |
| 6,629,851 | B1 * | 10/2003 | Kikuchi et al. | 439/79 |
| 6,634,561 | B1 * | 10/2003 | Wallace | 235/492 |
| 6,671,808 | B1 * | 12/2003 | Abbott et al. | 726/4 |
| 6,676,419 | B1 * | 1/2004 | Lin et al. | 439/76.1 |
| 6,676,420 | B1 * | 1/2004 | Liu et al. | 439/131 |
| 6,718,407 | B2 * | 4/2004 | Martwick | 710/51 |
| 6,733,329 | B2 * | 5/2004 | Yang | 439/518 |
| 6,740,964 | B2 * | 5/2004 | Sasaki | 257/687 |
| 6,744,634 | B2 | 6/2004 | Yen | |
| 6,757,783 | B2 * | 6/2004 | Koh | 711/115 |
| 6,763,410 | B2 * | 7/2004 | Yu | 710/74 |
| 6,773,192 | B1 * | 8/2004 | Chao | 401/195 |
| 6,778,401 | B1 | 8/2004 | Yu et al. | |
| 6,832,281 | B2 * | 12/2004 | Jones et al. | 710/301 |
| 6,854,984 | B1 * | 2/2005 | Lee et al. | 439/79 |
| 6,877,994 | B2 * | 4/2005 | Huang | 439/76.1 |
| 6,900,988 | B2 | 5/2005 | Yen | |
| 6,922,343 | B2 | 7/2005 | Nakanishi et al. | |
| 6,924,547 | B2 * | 8/2005 | Kanemoto et al. | 257/666 |
| 6,932,629 | B2 * | 8/2005 | Ikenoue | 439/138 |
| 6,940,153 | B2 * | 9/2005 | Spencer et al. | 257/659 |
| 6,944,028 | B1 * | 9/2005 | Yu et al. | 361/737 |
| 6,979,210 | B2 * | 12/2005 | Regen et al. | 439/131 |
| 6,980,188 | B1 * | 12/2005 | Worley et al. | 345/90 |
| 7,004,780 | B1 * | 2/2006 | Wang | 439/353 |
| 7,009,847 | B1 * | 3/2006 | Wu et al. | 361/737 |
| 7,011,247 | B2 * | 3/2006 | Drabczuk et al. | 235/451 |
| 7,017,248 | B2 * | 3/2006 | Choi et al. | 29/402.08 |
| 7,021,971 | B2 * | 4/2006 | Chou et al. | 439/660 |
| 7,035,110 | B1 * | 4/2006 | Wang et al. | 361/737 |
| 7,048,197 | B2 * | 5/2006 | Nishizawa et al. | 235/492 |
| 7,055,757 | B2 | 6/2006 | Nishizawa et al. | |

(56) References Cited

U.S. PATENT DOCUMENTS

| | | | |
|---|---|---|---|
| 7,059,871 B1 * | 6/2006 | Hsiao | 439/76.1 |
| 7,089,661 B2 | 8/2006 | Fong et al. | |
| 7,089,961 B2 * | 8/2006 | Morton et al. | 137/625.3 |
| 7,103,684 B2 * | 9/2006 | Chen et al. | 710/62 |
| 7,103,830 B1 * | 9/2006 | Dong | 714/784 |
| 7,104,809 B1 * | 9/2006 | Huang | 439/76.1 |
| 7,104,848 B1 | 9/2006 | Chou et al. | |
| 7,108,560 B1 | 9/2006 | Chou et al. | |
| 7,125,287 B1 | 10/2006 | Chou et al. | |
| 7,153,148 B2 * | 12/2006 | Chen et al. | 439/141 |
| 7,224,052 B2 | 5/2007 | Nishizawa et al. | |
| 7,234,644 B2 | 6/2007 | Nishizawa et al. | |
| 7,238,053 B1 * | 7/2007 | Liu et al. | 439/630 |
| 7,259,967 B2 * | 8/2007 | Ni | 361/760 |
| 7,269,004 B1 * | 9/2007 | Ni et al. | 361/679.41 |
| 7,296,098 B2 * | 11/2007 | Shih | 710/13 |
| 7,361,032 B2 * | 4/2008 | Loftus | 439/131 |
| 7,364,090 B2 * | 4/2008 | Cuellar et al. | 235/492 |
| 7,375,975 B1 * | 5/2008 | Jang et al. | 361/752 |
| 7,383,362 B2 * | 6/2008 | Yu et al. | 710/22 |
| 7,392,230 B2 * | 6/2008 | Nugent | 706/15 |
| 7,407,393 B2 * | 8/2008 | Ni et al. | 439/131 |
| 7,416,419 B2 * | 8/2008 | Collantes et al. | 439/76.1 |
| 7,420,803 B2 * | 9/2008 | Hsueh et al. | 361/679.41 |
| 7,422,454 B1 * | 9/2008 | Tang et al. | 439/131 |
| 7,462,044 B1 * | 12/2008 | Regen et al. | 439/131 |
| 7,473,112 B2 * | 1/2009 | Zhu et al. | 439/142 |
| 7,540,784 B1 * | 6/2009 | Zhang et al. | 439/638 |
| 7,547,961 B2 | 6/2009 | Nishizawa et al. | |
| 7,608,787 B2 * | 10/2009 | Takemoto et al. | 174/260 |
| 7,616,447 B2 | 11/2009 | Yamada et al. | |
| 7,652,892 B2 * | 1/2010 | Shiu et al. | 361/752 |
| 7,709,946 B2 * | 5/2010 | Ryu et al. | 257/692 |
| 7,798,821 B2 * | 9/2010 | Liu et al. | 439/76.1 |
| 7,830,666 B2 * | 11/2010 | Hiew et al. | 361/737 |
| 7,872,871 B2 * | 1/2011 | Hiew et al. | 361/730 |
| 7,872,873 B2 | 1/2011 | Hiew et al. | |
| 7,878,852 B2 * | 2/2011 | Hiew et al. | 439/607.01 |
| 8,102,657 B2 | 1/2012 | Hiew et al. | |
| 2001/0038547 A1 * | 11/2001 | Jigour et al. | 365/43 |
| 2001/0043174 A1 * | 11/2001 | Jacobsen et al. | 345/87 |
| 2002/0001175 A1 * | 1/2002 | Unrein | 361/687 |
| 2002/0036922 A1 * | 3/2002 | Roohparvar | 365/185.11 |
| 2002/0116668 A1 * | 8/2002 | Chhor et al. | 714/42 |
| 2002/0166023 A1 * | 11/2002 | Nolan et al. | 711/103 |
| 2002/0186549 A1 * | 12/2002 | Bolken | 361/737 |
| 2003/0038043 A1 * | 2/2003 | Painsith | 206/234 |
| 2003/0046510 A1 * | 3/2003 | North | 711/203 |
| 2003/0094490 A1 * | 5/2003 | Lee | 235/441 |
| 2003/0100203 A1 * | 5/2003 | Yen | 439/79 |
| 2003/0104835 A1 * | 6/2003 | Douhet | 455/557 |
| 2003/0145141 A1 * | 7/2003 | Chen et al. | 710/74 |
| 2003/0163656 A1 * | 8/2003 | Ganton | 711/154 |
| 2003/0177300 A1 * | 9/2003 | Lee et al. | 711/103 |
| 2003/0182528 A1 * | 9/2003 | Ajiro | 711/167 |
| 2003/0198028 A1 | 10/2003 | Nakanishi et al. | |
| 2003/0207601 A1 * | 11/2003 | Adachi | 439/135 |
| 2003/0223286 A1 * | 12/2003 | Lee | 365/200 |
| 2004/0034765 A1 * | 2/2004 | James | 713/1 |
| 2004/0066693 A1 * | 4/2004 | Osako et al. | 365/222 |
| 2004/0087213 A1 * | 5/2004 | Kao | 439/638 |
| 2004/0137664 A1 * | 7/2004 | Elazar et al. | 438/127 |
| 2004/0143716 A1 * | 7/2004 | Hong | 711/170 |
| 2004/0145875 A1 * | 7/2004 | Yu et al. | 361/752 |
| 2004/0148482 A1 * | 7/2004 | Grundy et al. | 711/167 |
| 2004/0153595 A1 * | 8/2004 | Sukegawa et al. | 710/305 |
| 2004/0195339 A1 * | 10/2004 | Chen et al. | 235/492 |
| 2004/0255054 A1 * | 12/2004 | Pua et al. | 710/5 |
| 2005/0008388 A1 * | 1/2005 | Karasawa | 399/92 |
| 2005/0009388 A1 | 1/2005 | Chao | |
| 2005/0114587 A1 * | 5/2005 | Chou et al. | 711/103 |
| 2005/0182858 A1 * | 8/2005 | Lo et al. | 710/1 |
| 2005/0193161 A1 | 9/2005 | Lee et al. | |
| 2005/0193162 A1 * | 9/2005 | Chou et al. | 711/103 |
| 2005/0216624 A1 * | 9/2005 | Deng et al. | 710/74 |
| 2005/0218200 A1 * | 10/2005 | Focke et al. | 229/110 |
| 2005/0248926 A1 * | 11/2005 | Asom et al. | 361/752 |
| 2005/0254219 A1 | 11/2005 | Nakanishi et al. | |
| 2007/0263365 A1 * | 11/2007 | Yamada et al. | 361/737 |
| 2008/0093720 A1 * | 4/2008 | Hiew et al. | 257/679 |
| 2008/0094807 A1 * | 4/2008 | Hiew et al. | 361/737 |
| 2009/0093136 A1 * | 4/2009 | Hiew et al. | 439/55 |
| 2013/0183862 A1 * | 7/2013 | Ni et al. | 439/620.22 |

OTHER PUBLICATIONS

USB 'A' Plug Form Factor, Revision 0.9, Guideline for Embedded USB Device Applications, Nov. 29, 2004, 4 pages.

PQI, "Intelligent Stick" F1ADP/1699 Web, Sep. 2003, 2 pages.

* cited by examiner

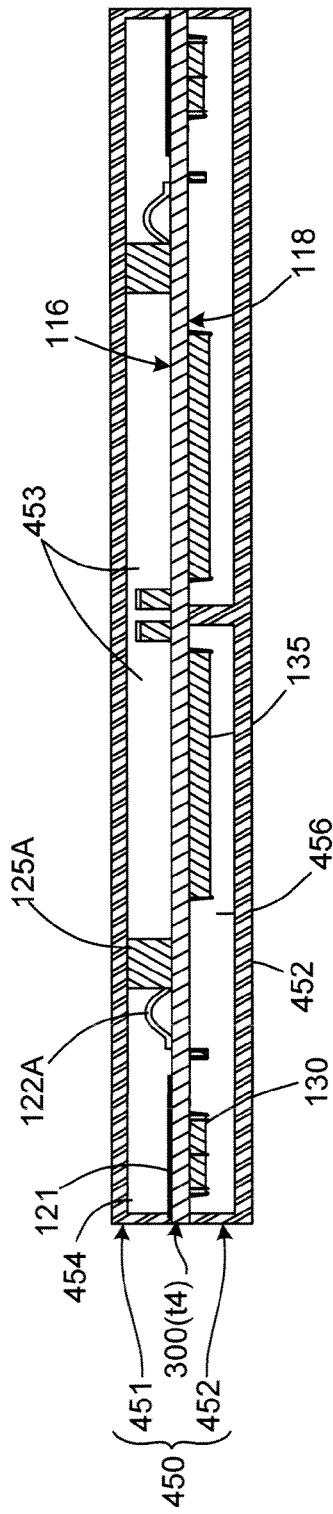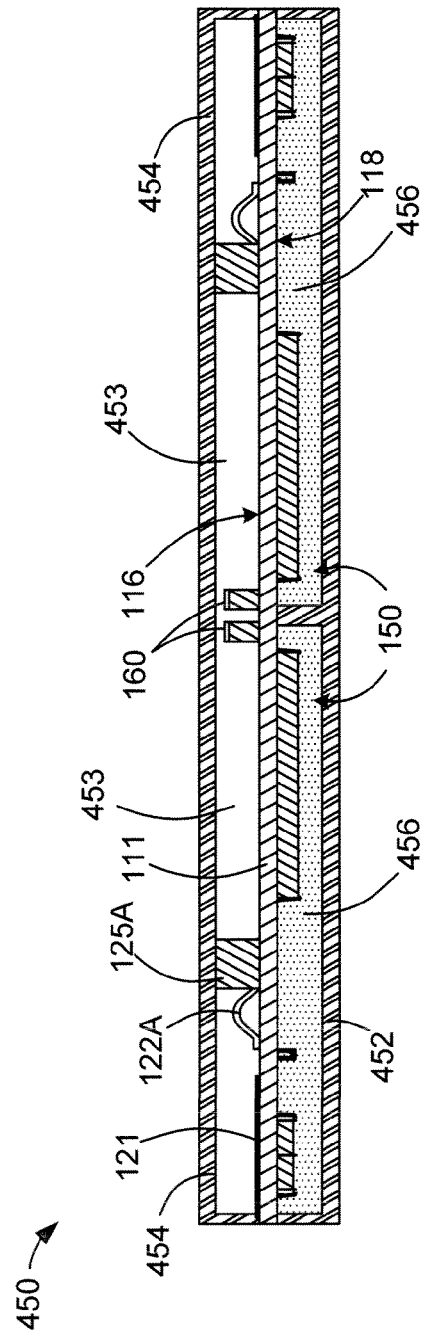
FIG. 16
FIG. 17

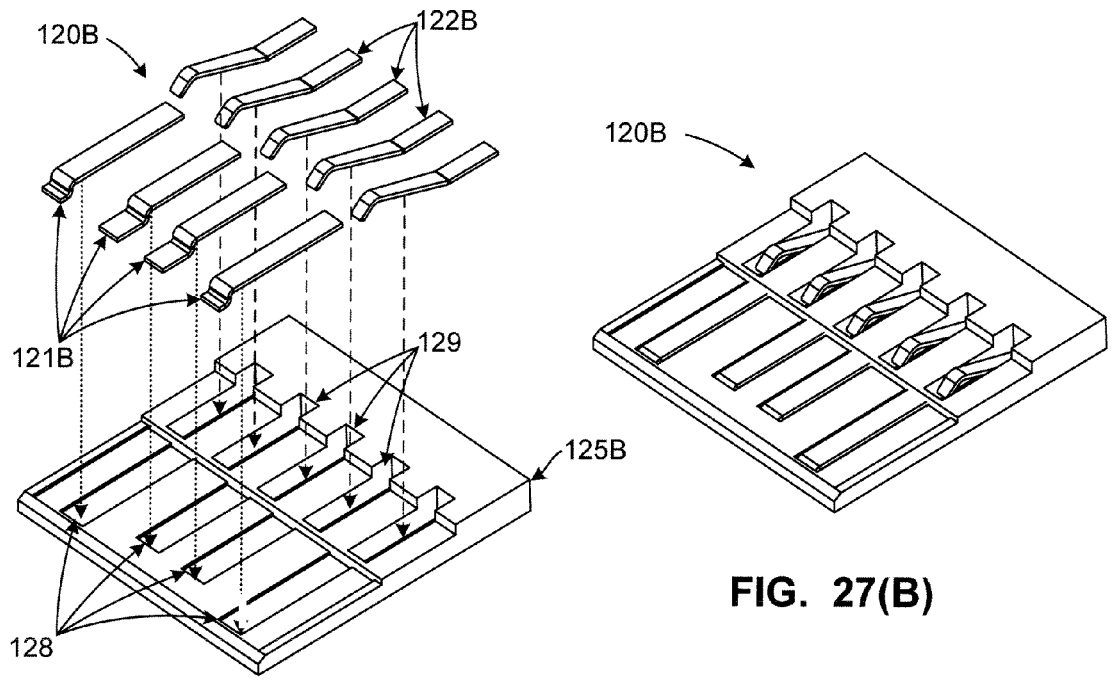
FIG. 27(A)
FIG. 27(B)
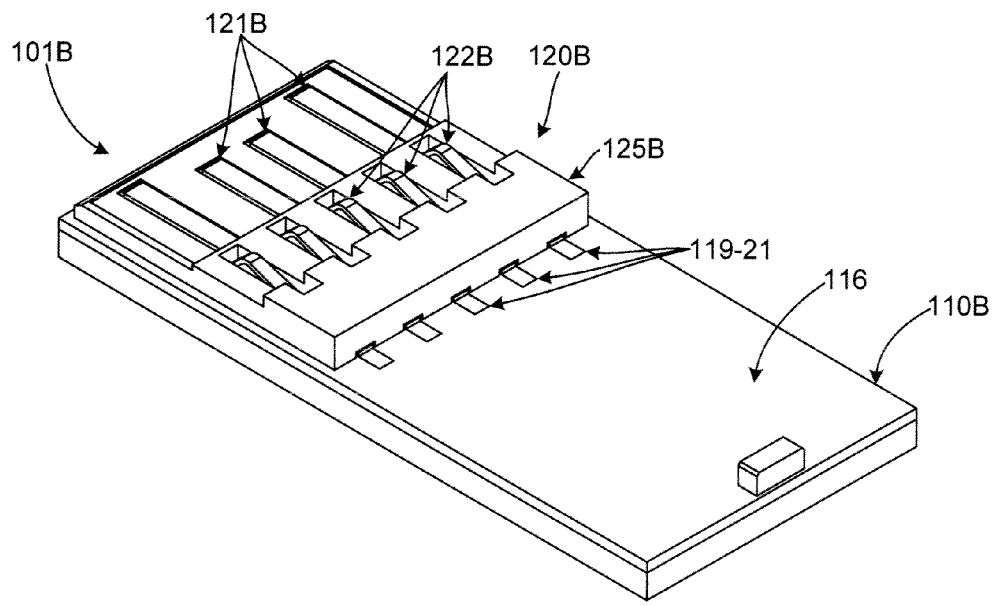
FIG. 28

MOLDING METHOD FOR COB-EUSB DEVICES AND METAL HOUSING PACKAGE

RELATED APPLICATIONS

This application is a continuation-in-part (CIP) of U.S. patent application for "SINGLE SHOT MOLDING METHOD FOR COB USB/EUSB DEVICES WITH CONTACT PAD RIBS", U.S. application Ser. No. 13/274,188, filed Oct. 14, 2011, which is a divisional of U.S. patent application for "SINGLE SHOT MOLDING METHOD FOR COB USB/EUSB DEVICES WITH CONTACT PAD RIBS", U.S. application Ser. No. 12/234,581, filed Sep. 19, 2008, now U.S. Pat. No. 8,102,657, which is a continuation-in-part (CIP) of U.S. patent application for "MOLDING METHODS TO MANUFACTURE SINGLE-CHIP CHIP-ON-BOARD USB DEVICE", U.S. application Ser. No. 11/773,830, filed Jul. 5, 2007, now U.S. Pat. No. 7,872,871, which is a CIP of "Single-Chip Multi-Media Card/Secure Digital (MMC/SD) Controller Reading Power-On Boot Code from Integrated Flash Memory for User Storage", U.S. application Ser. No. 11/309,594, filed Aug. 28, 2006, now U.S. Pat. No. 7,383,362 which is a CIP of "Single-Chip USB Controller Reading Power-On Boot Code from Integrated Flash Memory for User Storage", U.S. application Ser. No. 10/707,277, filed Dec. 2, 2003, now U.S. Pat. No. 7,103,684.

This application is also related to "SINGLE CHIP UNIVERSAL SERIAL BUS (USB) PACKAGE WITH METAL HOUSING" now U.S. Pat. No. 7,878,852.

FIELD OF THE INVENTION

This invention relates to portable electronic devices, and more particularly to portable electronic devices including Universal-Serial-Bus (USB) or Extended Universal-Serial-Bus (EUSB) connections.

BACKGROUND OF THE INVENTION

Universal-Serial-Bus (USB) has been widely deployed as a standard bus for connecting peripherals such as digital cameras and music players to personal computers (PCs) and other devices. Currently, the top transfer rate of USB is 480 Mb/s, which is quite sufficient for most applications. Faster serial-bus interfaces are being introduced to address different requirements. PCI Express, at 5.0 Gb/s, and SATA, at 1.5 Gb/s and 6.0 Gb/s, are two examples of high-speed serial bus interfaces for the next generation devices, as are IEEE 1394 and Serial Attached Small-Computer System Interface (SCSI).

FIG. 30(A) shows a prior-art peripheral-side USB connector. USB connector 10 may be mounted on a board in the peripheral. USB connector 10 can be mounted in an opening in a plastic case (not shown) for the peripheral.

USB connector 10 contains a small connector substrate 14, which is often white ceramic, black rigid plastic, or another sturdy substrate. Connector substrate 14 has four or more metal contacts 16 formed thereon. Metal contacts 16 carry the USB signals generated or received by a controller chip in the peripheral. USB signals include power, ground, and serial differential data D+, D−.

USB connector 10 contains a metal case that wraps around connector substrate 14. The metal case touches connector substrate 14 on three of the sides of connector substrate 14. The top side of connector substrate 14, holding metal contacts 16, has a large gap to the top of the metal case. On the top and bottom of this metal wrap are formed holes 12. USB connector 10 is a male connector, such as a type-A USB connector.

FIG. 30(B) shows a female USB connector. Female USB connector 20 can be an integral part of a host or PC, or can be connected by a cable. Another connector substrate 22 contains four metal contacts 24 that make electrical contact with the four metal contacts 16 of the male USB connector 10 of FIG. 30(A). Connector substrate 22 is wrapped by a metal case, but small gaps are between the metal case and connector substrate 22 on the lower three sides.

Locking is provided by metal springs 18 in the top and bottom of the metal case. When male USB connector 10 of FIG. 30(A) is flipped over and inserted into Female USB connector 20 of FIG. 30(B), metal springs 18 lock into holes 12 of male USB connector 10. This allows the metal casings to be connected together and grounded.

Other bus interfaces offer higher transfer rates than USB devices, which have a top transfer rate of 480 Mb/s. For example, Peripheral-Component-Interconnect(PCI) Express (5.0 Gb/s) and Serial-Advanced-Technology-Attachment (SATA) (1.5 Gb/s and 6.0 Gb/s) are two examples of high-speed serial bus interfaces for next generation devices. IEEE 1394 (Firewire) supports 3.2 Gb/s. Serial Attached Small-Computer System Interface (SCSI) supports 1.5 Gb/s. These high speed interfaces renders standard USB devices undesirable for some applications.

What is needed is a high speed USB flash memory device using a single dual-personality flexible system that supports both standard Universal-Serial-Bus (USE) devices and a higher speed USB targeted at 5.0 Gb/S with the addition of extra transmit and receive signal pairs, plus a ground line that serves as separating line to the two communication signal pairs that make up the extended five additional pins. What is particularly needed is a method for producing such devices in a cost effective manner.

SUMMARY OF THE INVENTION

The present invention is directed to high speed extended USB (EUSB) devices having a single-shot molded housing formed on one side of a printed circuit board assembly (PCBA), and several curved EUSB contact springs mounted on the opposing PCBA surface using efficient surface mounting techniques, thereby providing an inexpensive and reliable EUSB device. According to an aspect of the present invention, the PCBA includes a PCB including standard USB metal contact pads and the curved EUSB contact springs disposed on a top (first) surface, and passive components and integrated circuits (ICs) mounted on a bottom (second) surface. A single-shot molded housing is formed in a single shot molding process such that the housing is formed only on the second surface of the PCBA (e.g., such that the ICs and at least some of the passive components are encased by the housing, the top PCB surface is entirely exposed). By utilizing a single shot molding process to form the single-shot molded housing over the PCBA, the present invention provides an inexpensive manufacturing method (i.e., lower cost and high assembly throughput when compared with assembly using external shell casings) that also provides greater moisture and water resistance and higher impact force resistance for the IC devices than that achieved using conventional manufacturing methods.

In accordance with an embodiment of the present invention, a dual-personality memory system supports both standard USB 2.0 devices and high speed extended USB (EUSB) devices that are formed in accordance with the method provided above. A host side of the dual-personality memory system includes a multiple pin (e.g., nine-pin) USB female socket that is similar to a standard female USB socket, but in addition to the standard (four) USB contact pins utilized to facilitate communications with standard USB 2.0 devices, the extended multiple pin USB socket includes one or more additional rows of contacts that facilitate extended communications (i.e., including additional transmitting/receiving differential pairs) between the host system and dual personality "extended" USB (EUSB) devices (e.g., memory cards). Each EUSB device includes both standard USB contacts, a second row of extended function contacts, and a special controller that facilitates communication with a host system using either the standard serial USB communication protocol using the four standard USB contacts (e.g., when the EUSB device is plugged into a "standard" USB female socket), or extended communications using both the standard contacts and the second row of contacts (e.g., when the EUSB device is plugged into the multiple pin USB female socket of a dual-personality memory system).

In accordance with a specific embodiment of the present invention, a EUSB device includes both standard USB metal contacts and a row of metal contact springs, wherein the metal contact springs extend from the EUSB device in a way that facilitates reliable extended (e.g., nine bit) communications. The EUSB device includes a printed circuit board assembly (PCBA) including at least one dual-personality communication integrated circuit (IC) mounted on a lower surface of the PCB, four standard USB fixed contacts disposed near the PCB's front edge, and several (e.g., five) metal contact springs positioned behind the standard USB contacts. In accordance with an aspect of the invention, the metal contact springs are soldered to input/output (I/O) contact pads disposed on an upper surface of the PCB such that a contact portion of each contact spring protrudes above the upper surface of the PCB. By soldering two ends of the contact springs to the PCBA, the contact springs are provided with sufficient tolerance to both reliably contact corresponding contact pads of a host female socket, and are also able to bend without breaking or becoming dislodged when the contact springs are pressed against the corresponding contact pads of a host female socket. A dual-personality communication IC is configured to selectively communicate either with a standard USB host system by way of the standard USB contacts (only), or with a dual-personality flash memory card system by way of all (e.g., nine) contact pads/springs.

In accordance with another embodiment of the present invention, the EUSB device is manufactured by forming a contact spring assembly in which the contact springs are secured to a (e.g., plastic) spring guide block, and then the contact spring assembly mounted onto the device PCB. In one embodiment, the PCB includes standard USB contact pads formed on the upper surface of the PCB in front of the contact spring assembly, and in another embodiment the four standard USB contact pads are disposed on the spring guide block. An appropriate number of I/O contact pads are formed on the upper surface of the PCB to facilitate connections to the contact springs and contact pads disposed on the contact spring assembly, and additional contact pads are provided on the lower PCB surface for mounting the one or more ICs and the passive components. By securing the five contact springs to the plastic guide block, accurate assembly of the five contact springs onto the PCB is easily performed in minimal time. In addition, by soldering at least one end of the contact springs to the PCBA, the contact springs are provided with sufficient tolerance to both reliably contact corresponding contact pads of a host female socket, and are also able to bend without breaking or becoming dislodged when the contact springs are pressed against the corresponding contact pads of a host female socket. The PCBA is then placed in a mold cavity, and a single-shot molded housing is formed such that a housing is formed only over the bottom PCB surface such that the passive components and ICs are entirely encased in housing material. The resulting EUSB device forms a modular structure including a connector plug with the standard USB metal contact pads and the contact springs being arranged such that, when said connector plug is inserted into said extended multiple pin USB socket, each of the standard USB contact pads contacts a corresponding standard USB contact of the extended multiple pin USB socket, and each of the contact springs contacts a corresponding dual-personality contact of the extended multiple pin USB socket. By forming the EUSB device in this manner, final assembly of the EUSB device into any of several external housings is greatly simplified, which reduces manufacturing costs by simplifying the assembly process.

According to an aspect of the invention, passive components are mounted onto the PCB using one or more standard surface mount technology (SMT) techniques, and one or more unpackaged IC die (e.g., the dual-personality communication IC die and a flash memory die) are mounted using chip-on-board (COB) techniques. During the SMT process, the SMT-packaged passive components (e.g., capacitors, oscillators, and light emitting diodes) are mounted onto contact pads disposed on the PCB, and then known solder reflow techniques are utilized to connect leads of the passive components to the contact pads. In alternative embodiment, the passive components are either disposed on the lower PCB surface or on the upper PCB surface (e.g., to minimize the size of the PCB). During the subsequent COB process, the IC dies are secured onto the PCB using known die-bonding techniques, and then electrically connected to corresponding contact pads using, e.g., known wire bonding techniques. After the COB process is completed, the housing is formed over the passive components and IC dies using plastic molding techniques. By combining SMT and COB manufacturing techniques to produce modular USB core components, the present invention provides several advantages over conventional manufacturing methods that utilize SMT techniques only. First, by utilizing COB techniques to mount the USB controller and flash memory, the large PCB area typically taken up by SMT-packaged controllers and flash devices is dramatically reduced, thereby facilitating significant miniaturization of the resulting footprint (i.e., providing a shorter device length and thinner device width). Second, the IC die height is greatly reduced, thereby facilitating stacked memory arrangements that greatly increase memory capacity of the EUSB devices without increasing the EUSB device footprint. Further, overall manufacturing costs are reduced by utilizing unpackaged controllers and flash devices (i.e., by eliminating the cost associated with SMT-package normally provided on the controllers and flash devices). Therefore, the combined COB and SMT method according to the present invention provides a less expensive and higher quality (i.e., more reliable) memory product with a smaller size than that possible using conventional SMT-only manufacturing methods.

According to an embodiment of the present invention, the EUSB device is disposed in a plastic molded external housing so as to form a device assembly including a standard USB metal plug shell and a case/cover. By forming the EUSB device in the manner described above, the present invention greatly simplifies the assembly process utilized to form the device assembly, thus reducing overall costs.

BRIEF DESCRIPTION OF THE DRAWINGS

These and other features, aspects and advantages of the present invention will become better understood with regard to the following description, appended claims, and accompanying drawings, where:

FIG. 16 is a simplified cross-sectional side view depicting the PCB panel of FIG. 14(B) disposed inside the molding die assembly of FIG. 15;

FIG. 17 is a simplified cross-sectional side view depicting a molding process for forming a molded housings over the PCB panel of FIG. 14(B) utilizing the molding die assembly of FIG. 15 according to the method of FIG. 4;

FIGS. 27(A) and 27(B) are exploded perspective and assembled perspective views showing a spring assembly utilized in the EUSB device of FIG. 26;

FIG. 28 is perspective view showing the EUSB device of FIG. 26 in an assembled state;

DETAILED DESCRIPTION OF THE DRAWINGS

The present invention relates to an improved method for manufacturing extended USB (EUSB) devices (e.g., memory cards), and in particular to EUSB devices manufactured by the method. The following description is presented to enable one of ordinary skill in the art to make and use the invention as provided in the context of a particular application and its requirements. As used herein, the terms "upper", "upwards", "lower", "downward", "front" and "back" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
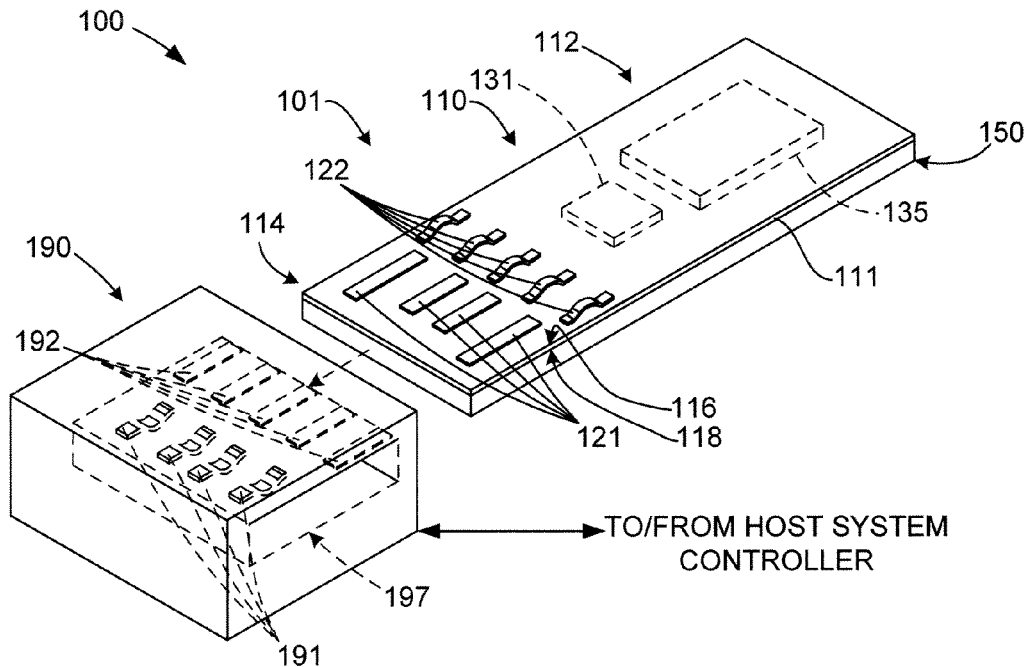
FIGS. 1(A), 1(B), 1(C) are perspective top, cross sectional side and cross sectional side views, respectively, showing a dual-personality USB memory system including an EUSB device according to a simplified embodiment of the present invention.
Figure 1B:
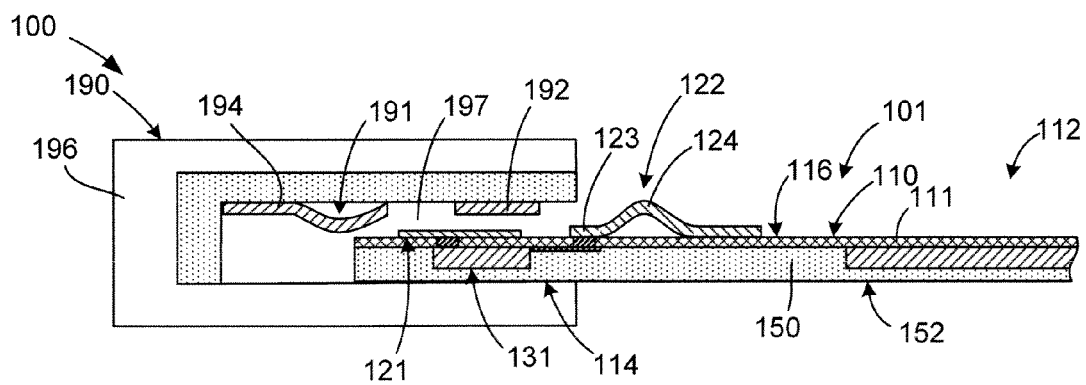
Figure 1C:
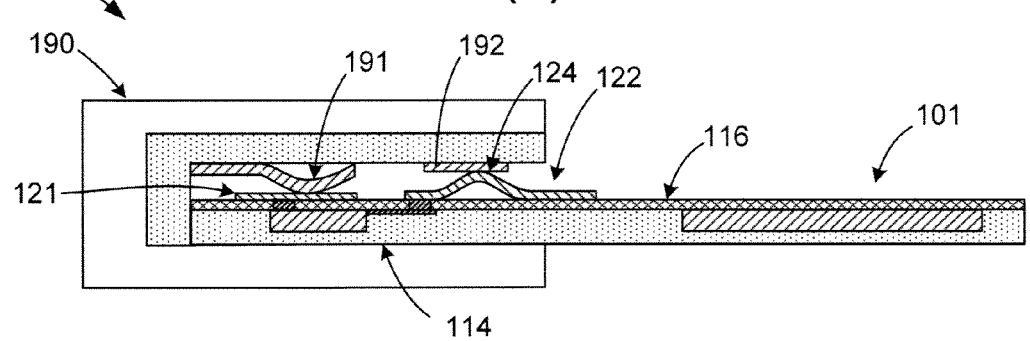

FIGS. 1(A), 1(B) and 1(C) show a dual-personality USB memory system 100 including an extended 9-pin (multiple pin) USB female socket 190 that communicates with both standard USB memory cards and dual-personality extended USB (EUSB) devices 101 that are manufactured and operate in accordance with the present invention. That is, in accordance with the exemplary embodiment, dual-personality USB memory system 100 is operated to process (receive and transmit) both standard USB 2.0 (four pin) signals and extended function signals through extended 9-pin USB socket 190 in a manner consistent with that described in co-owned U.S. Pat. No. 7,108,560, entitled "Extend USB Protocol Plug and Receptacle for implementing Single-Mode Communication", which is incorporated herein by reference in its entirety. In particular, in accordance with the 9-pin embodiment disclosed herein, in additional to the four standard USB 2.0 signals (i.e., power, ground, D+ and D−), the extra five contact springs are utilized to transmit and additional ground (e.g., using the middle spring), a transmitting differential pair (T+ and T−), and a receiving differential pair (R+ and R−) using the left and right side contact spring pairs, respectively. Thus the term "extended USB" (EUSB) is used herein to mean at least one transmitting/receiving signal pair in addition to the four standard USB signals. With the additional of these signal pairs, transmitting/receiving modes can be executed concurrently without the wait state of transmitting on receiving to complete, and vice versa, thereby significantly enhancing communication speeds.

Referring to the right side of FIG. 1(A) and FIG. 1(B), EUSB device 101 generally includes a printed circuit board assembly (PCBA) 110 and a single-shot molded plastic housing 150. PCBA 110 includes a printed circuit board (PCB) 111 having opposing upper (first) surface 116 and an opposing lower (second) surface 118, and includes a handle (rear) portion 112 at a rear end of PCB 111 and a male plug (front portion) connector 114 at a front end of PCB 111. According to an aspect of the present invention, male plug connector 114 includes four standard USB (metal) contacts 121 (disposed on upper surface 116 in accordance with standard techniques, and five extended-use (metal) contact springs 122 arranged in a row behind standard USB contacts 121. A dual-personality communication integrated circuit (IC) 131 is mounted on lower surface 118, and conductive traces (not shown) are formed on PCB 111 using known techniques such that contacts 121 and 122 are connected to dual-personality communication IC 131. In addition, a memory (e.g., flash) IC 135 is mounted on lower surface 118 and connected to dual-personality communication IC 131 and contacts 121 and 122 by conductive traces (not shown). Other features and details associated with extended USB device 101 are provided below.

Because many conventional USB (male) connectors and (female) sockets (also referred to as standard USB plug connectors and standard USB sockets herein) are widely deployed, it is advantageous for the improved extended USB connector to be compatible with standard USB sockets, and an extended USB socket to be compatible with standard USB connectors for backward compatibility. Although the height and width of USB connectors/sockets have to remain the same for insertion compatibility, the length of each may be extended to fit additional metal contacts for additional signals. Furthermore, additional metal contacts (pins or springs) may be disposed on the plug connector, either adjacent to opposite the existing four standard USB metal contacts. As indicated in FIG. 1(A), plug connector 114 of EUSB device 101 represents such extended plug connector that includes the four standard USB metal contact pads 121 and the five additional (extended-use) contact springs 122 that are disposed in a row behind standard USB metal contact pads 121.

Referring to FIG. 1(B), to support communications with EUSB device 101, extended 9-pin USB female socket 190 includes four standard USB metal contact pins 191 and five additional (dual-personality) contact pads 192 that are disposed on the bottom surface of a pin substrate 194 to engage standard USB metal contact pads 121 and additional contact springs 122 when plug connector 114 is inserted therein. Female socket 190 also includes an outer (e.g., metal) casing 196 that cooperates with substrate 194 to define a cavity (slot) 197 for receiving plug connector 114. FIG. 1(B) shows plug connector 114 inserted into 9-pin USB socket 190 such that standard USB metal contact pins 191 of socket 190 contact standard USB metal contacts 121 of extended USB device 101, and additional contact pads 192 of socket 190 contact additional contact springs 122 of extended USB device 101, thereby facilitating 9-pin communication between extended USB device 101 and a host system controller (not shown) that is connected to socket 190.

As indicated in FIGS. 1(B) and 1(C), each contact spring 122 protrudes above planar upper surface 116 of PCB 111 by an amount that is sufficient to reliably contact corresponding contact pads 192 when EUSB device 101 is inserted into host female socket 190. That is, each metal contact spring 122 includes a base portion 123 that is disposed on upper surface 116 of PCB 111, and includes a curved raised contact portion 124 that extends above upper surface 116. Each metal contact spring 122 is connected to at least one of dual-personality communication IC 131 and memory IC 135 by corresponding contact pads and traces. FIG. 1(B) shows EUSB device 101 partially inserted into host female socket 190, and shows that a lower surface of contact pad 192 is below the upper point of contact portion 124, whereby when EUSB device 101 is fully inserted (as shown in FIG. 1(C)), contact portion 124 reliably contacts contact pad 192, and contact spring 122 bends downward slightly toward upper surface 116. By forming each contact spring 122 in this manner, contact portion 124 is provided with sufficient tolerance (i.e., extends far enough above upper surface 116) to assure contact with corresponding contact pad 192, and the ability to flex downward when such contact occurs, thereby providing a suitable design variance that produces reliable connection between extended-USB socket 190 and EUSB device 101.

In accordance with an aspect of the present invention, single-shot molded housing 150 is formed during a single-shot molding process described below, where the molding die (cover plates) prevent the formation of molding material on contact pads 121 and contact springs 122. In particular, as shown in FIG. 1(A), upper surface 116 is entirely devoid of plastic molded material.

Figure 2:
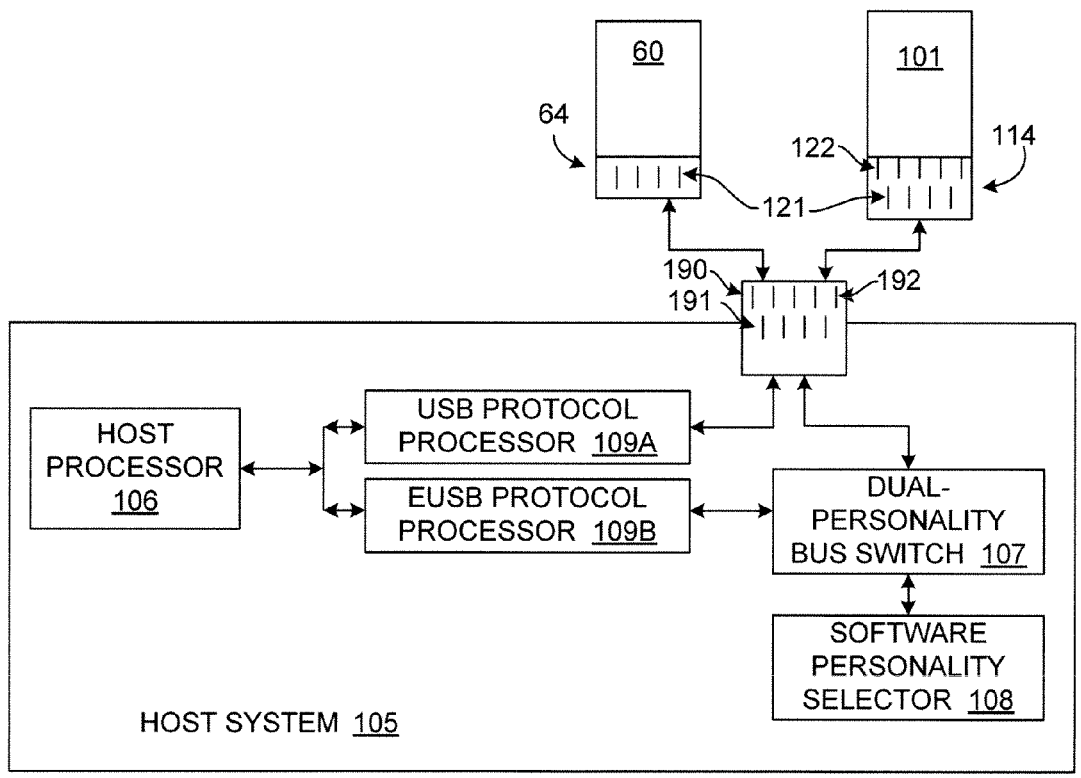
FIG. 2 is a simplified block diagram showing a host system of the dual-personality USB memory system of FIG. 1.

FIG. 2 is a block diagram of an exemplary host system 105 with one embodiment of extended-USE socket 190 that supports extended-mode communication. Although the description below refers only to communications with standard USB memory cards 60 and EUSB device 101, those skilled in the art will recognize that the sockets and extended USB memory card features described herein can be altered to accommodate one or more of a variety of other flash memory devices (e.g., SD, MMC, SATA, PCI-Express, Firewire IEEE 1394, or Serial-Attached SCSI). As shown in FIG. 2, host system 105 includes a processor 106 for executing programs including USB-management and bus-scheduling programs. Dual-personality serial-bus interface 107 processes data from processor 106 using two protocol processors including a standard USB protocol processor 109A and an EUSB protocol processor 109B. USB processor 109A processes data using the USB protocol, and inputs and outputs USB data on the four standard USB contacts 191 in extended USB socket 190 (which communicate with standard USB metal contacts 121 of an inserted standard USB memory card 60 or EUSB device 101). In contrast, the extended metal contact pins 192 of extended USB socket 190 (which communicate with contact springs 122 of EUSB device 101, when inserted therein) are connected to dual-personality bus switch 107. Transceivers in dual-personality bus switch 107 buffer data transmitted and received as pairs of differential signals sent over data lines connected to the extended metal contacts to facilitate the EUSB protocol. When an initialization routine executed by processor 106 determines that inserted flash memory device supports the EUSB protocol, personality selector 108 configures dual-personality bus switch 107 to connect extended USB socket 190 to EUSB processor 109B. Processor 106 communicates with EUSB processor 109B instead of USB processor 109A when extended mode is activated. Additional details regarding the operation of host 105 will be apparent to those skilled in the art based on the teachings in U.S. Pat. No. 7,108,560 (cited above) and the description provided below.

Figure 3A:
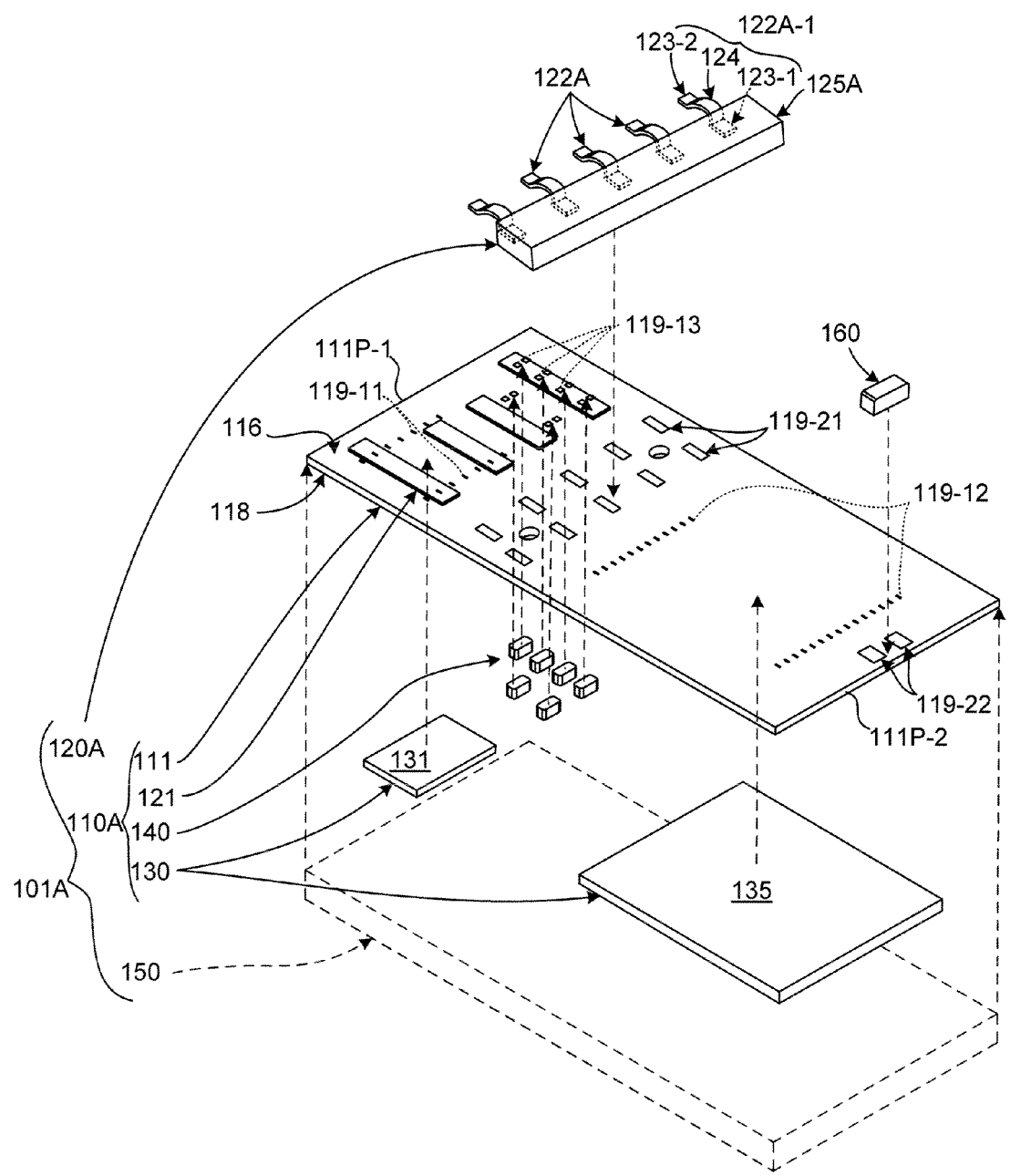
FIGS. 3(A) and 3(B) are exploded perspective and assembled perspective views showing an EUSB device according to a specific embodiment of the present invention.
Figure 3B:
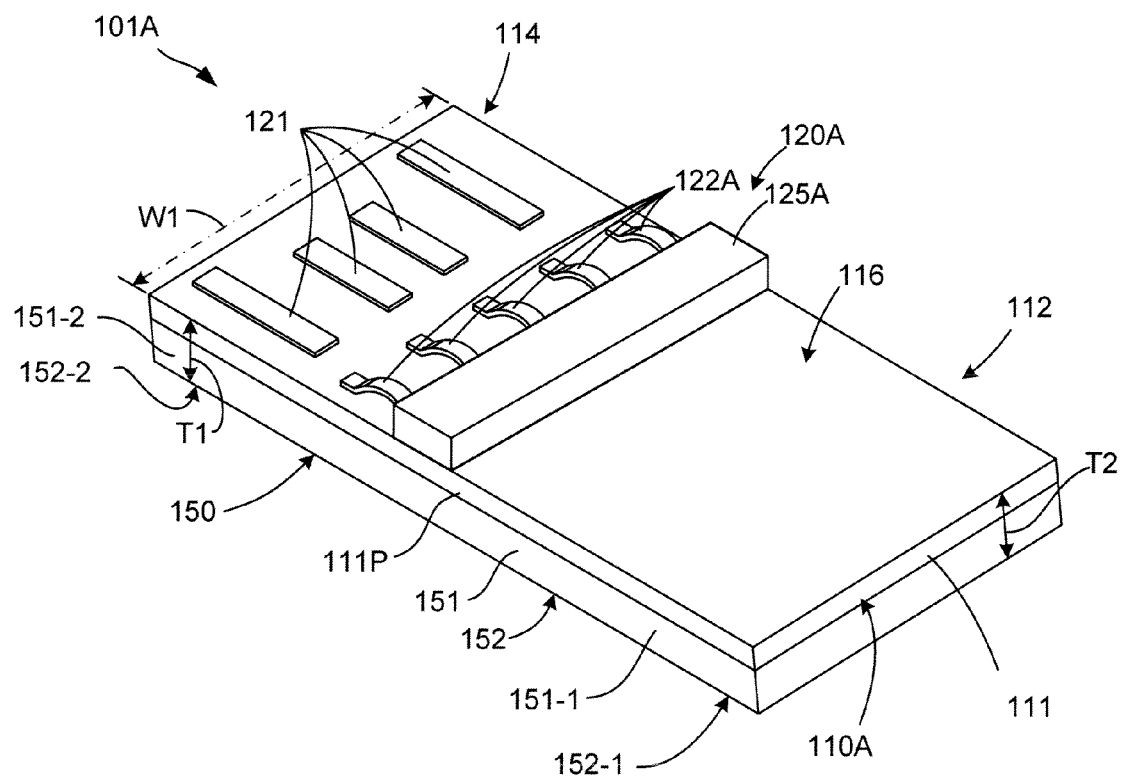

FIGS. 3(A) and 3(B) are exploded perspective and assembled perspective views showing a simplified EUSB device 101A that is produced according to a specific embodiment of the present invention. As set forth below, and with reference to the flow diagram of FIG. 4, EUSB device 101A is manufactured by forming a contact spring assembly 120A in which contact springs 122A are mounted on a plastic spring guide block 125A, and spring assembly 120A is then secured (e.g., soldered onto PCB 111 such that contact portions 124 of each contact spring 122A protrude away from PCB 111, and guide block 125A is secured (e.g., by an adhesive or solder) to PCB 111.

EUSB device 101A includes a PCBA 110A made up of a PCB 111 with standard USB contacts 121 formed on its upper surface 116 adjacent to a front edge portion 111P-1, and one or more ICs 130 (e.g., dual-personality communication IC 131 and memory IC 135) and passive components 140 mounted on lower PCB surface 118. PCB 111 is formed in accordance with known PCB manufacturing techniques such that metal contacts 121, IC dies 130, and passive components 140 are electrically interconnected by a predefined network including conductive traces and other conducting structures that are sandwiched between multiple layers of an insulating material (e.g., FR4) and adhesive. For example, contact pads 119-11 and 119-12 are disposed on lower surface 118 and used to connect dual-personality communication IC 131 and memory IC 135, respectively, using methods described below. Contact pads 119-13 are also provided on lower surface 118, and used to facilitate the mounting of passive components 140, as described in additional detail below.

As indicated in FIG. 3(A), according to an aspect of the present invention, spring assembly 120A is mounted onto upper surface 116 of the PCB 111 such that contact portion 124 of each contact spring 122A protrudes above upper PCB surface 116 in the manner described above with reference to FIG. 1(B). In one embodiment, each contact spring (e.g., contact spring 122A-1) is a substantially C-shaped spring structure having a first base portion 123-1 that is secured to guide block 125A, a second base portion 123-2 disposes away from guide block 125A, and a central contact portion 124 that forms an arched (curved or bent) structure extending between base portions 123-1 and 123-2. By forming the PCBA in this manner, when spring assembly 120A is mounted onto upper surface 116, at least one of base portions 123-1 and 123-2 are disposed in contact with upper surface 116 (i.e., in order to make electrical contact with corresponding input/output (I/O) contact pads 119-21), and contact portions 124 extend a suitable distance above upper surface 116. As described in further detail below, at least one of base portions 123-1 and 123-2 are then soldered to corresponding I/O contact pads 119-21, which are disposed on upper surface 116, in order to make reliable electrical connection with dual-personality communication IC 131. By forming EUSB device 101A in this manner, the formation of molded housing 150 and the final assembly of EUSB memory device 101A into any of several external housings (see examples below) is greatly simplified, which reduces manufacturing costs by simplifying the assembly process.

Housing 150 is molded plastic formed and arranged such that all of the plastic used to form housing 150 is entirely located below (i.e., on one side of) lower surface 118 of PCB 111. As indicated in FIG. 3(B), housing portion 150 includes a peripheral surface 151 extending downward (i.e., perpendicular to PCB 111), and a planar lower surface 152 that extends parallel to PCB 111. For discussion purposes, the portion of peripheral surface 151 surrounding handle section 112 of PCB 111 is referred to below as handle surface section 151-1, and the section of peripheral surface 151 surrounding plug section 114 of PCB 111 is referred to below as plug surface section 151-2. Similarly, the portion of lower surface 152 covering handle section 112 of PCB 111 is referred to below as handle surface section 152-1, and the section of lower surface 152 covering plug section 114 of PCB 111 is referred to below as plug cover section 152-2.

Referring to FIG. 3(A), according to the present embodiment, passive components 140 are mounted onto lower surface 118 of PCB 111 using one or more standard surface mount technology (SMT) techniques, one or more unpackaged IC dies 130 are mounted on PCB 111 using chip-on-board (COB) techniques, and an LED light device 160 is mounted onto upper surface 116 using one or more SMT techniques. During the SMT process, passive components 140, such as resistors, capacitors, and oscillator are mounted onto associated contact pads 119-13 disposed on lower surface 118, and are then secured to the contact pads using known solder reflow techniques. To facilitate the SMT process, each of the passive components is packaged in any of the multiple known (preferably lead-free) SMT packages (e.g., ball grid array (BGA) or thin small outline package (TSOP)). In contrast, IC dies 130 are unpackaged, semiconductor "chips" that are mounted onto surface 118 and electrically connected to corresponding contact pads using known COB techniques. Passive components 140, IC dies 131 and 135 and metal contacts 121 and 122A are operably interconnected by way of metal traces that are formed on and in PCB 111 using known techniques. Either before or after the above-mentioned SMT processing, LED component 160 is mounted onto associated contact pads 119-22 disposed on upper surface 116, and is then secured to the contact pads using known solder reflow techniques.

Referring to FIG. 3(B), a thickness T1 and width W1 of connector plug 114 is selected to produce a secure (snug) fit inside either an external case (discussed below) or directly into socket 190 (see FIG. 1). According to another aspect of the present invention, planar lower surface 152 is parallel to upper surface 116 of PCB 111, which are spaced such that a first thickness T1 of connector plug 114 (i.e., measured between upper surface 116 and lower housing surface 152 adjacent to metal contacts 121) is substantially equal to a second thickness T2 adjacent a rear end of handle section 114. That is, as indicated in FIG. 3(B), EUSB device 101A is substantially flat along its entire length (i.e., measured from the rear edge of handle section 112 to the front edge of plug section 114). In the embodiment shown in FIG. 3(B), the uppermost surface of EUSB device 101A is almost entirely formed by upper PCB surface 116, which is parallel to planar lower housing surface 152 along the entire length of EUSB device 101A.

Figure 4:
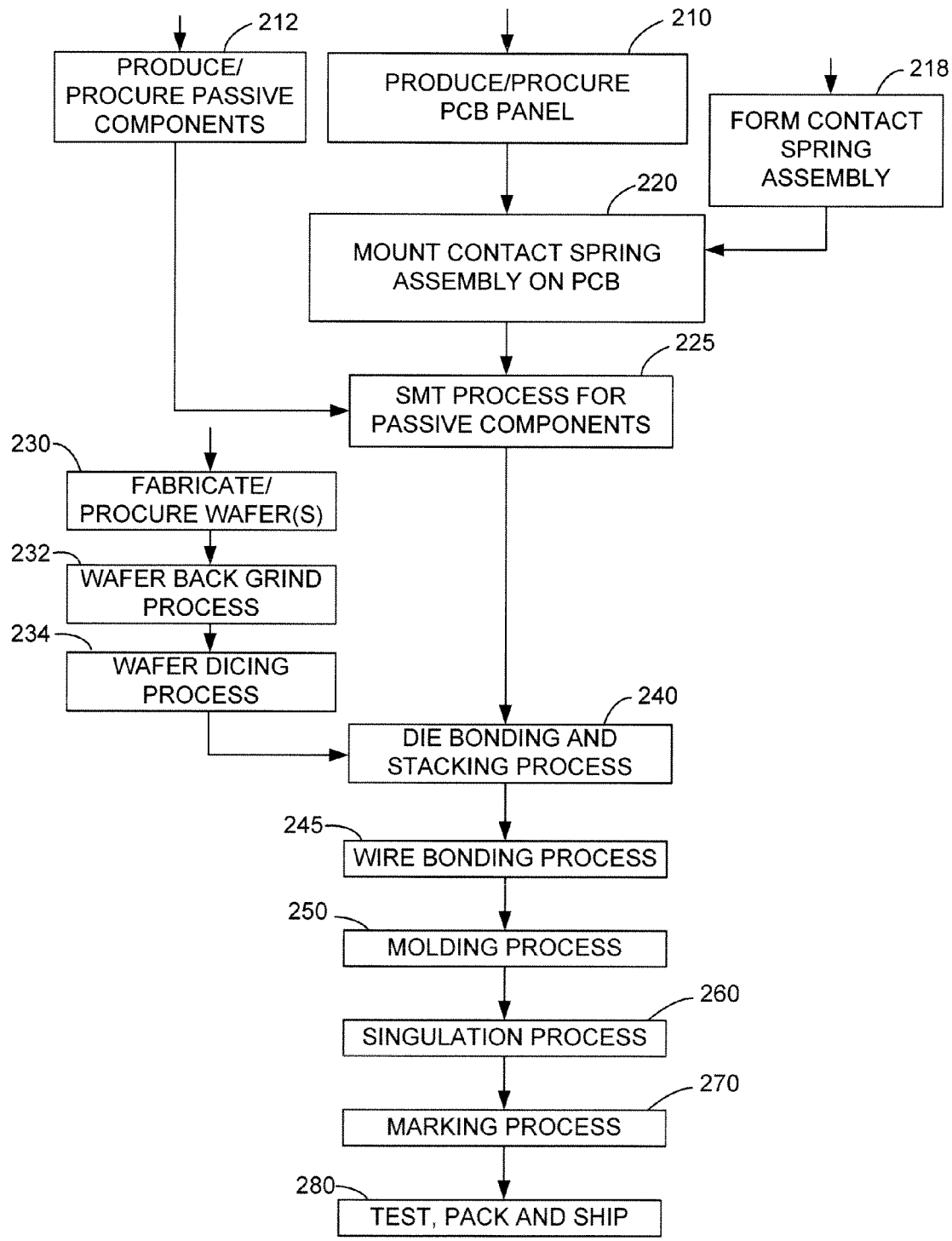
FIG. 4 is a flow diagram depicting a method for producing the extended USB dual-personality extended USB device of FIG. 3(A) according to another embodiment of the present invention.

FIG. 4 is a flow diagram showing a method for producing a EUSB device according to another embodiment of the present invention. Summarizing the novel method, a PCB panel is fabricated including multiple PCBs (block 210;

described below with reference to FIGS. 5 and 6). Contact springs are then mounted onto the PCB panel such that the contact portion of each contact spring protrude above the upper surface of the PCB (block 220; described below with reference to FIGS. 7-10). ICs and passive components are then attached to the PCBs (block 225-245; described below with reference to FIGS. 11-14), and then a single-shot molded housing is formed on the PCB such that the passive components and ICs are covered, and such that substantially all of the PCB's upper surface is exposed.

According to another aspect of the invention, the passive components are then mounted on the PCB panel using SMT techniques (block 225), and then unpackaged IC dies are die bonded and wire bonded onto the PCB panel using COB techniques (block 240). Plastic molding is then performed to form a plastic housing on the PCB panel in a single molding step (single-shot) (block 260), which is then singulated into individual EUSB devices (block 260). This portion of the method provides several advantages over conventional manufacturing methods that utilize SMT techniques only. First, by utilizing COB techniques to mount the USB controller and flash memory, the large amount of space typically taken up by these devices is dramatically reduced, thereby facilitating significant miniaturization of the resulting EUSB device footprint. Second, by implementing the wafer grinding methods described below, the die height is greatly reduced, thereby facilitating stacked memory arrangements such as those described below. The molded housing also provides greater moisture and water resistance and higher impact force resistance than that achieved using conventional manufacturing methods. In comparison to the standard USB memory card manufacturing that used SMT process, it is cheaper to use the combined COB and SMT (plus molding) processes described herein because, in the SMT-only manufacturing process, the bill of materials such as Flash memory and the EUSB controller chip are also manufactured by COB process, so all the COB costs are already factored into the packaged memory chip and controller chip. Therefore, the combined COB and SMT method according to the present invention provides a less expensive and higher quality (i.e., more reliable) extended USB memory card product with a smaller size than that possible using conventional SMT-only manufacturing methods.

Referring to the lower end of FIG. 4, the EUSB devices are marked (block 270), and then tested, packed and shipped (block 280). Optional final assembly is then performed by producing/procuring an external housing, and mounting a EUSB device into the external housing.

The flow diagram of FIG. 4 will now be described in additional detail below with reference to the following figures.

Referring to the upper portion of FIG. 4, the manufacturing method begins with filling a bill of materials including producing/procuring PCB panels (block 210), producing/procuring passive (discrete) components (block 212) such as resistors, capacitors, diodes, LEDs and oscillators that are packaged for SMT processing, producing spring assemblies (block 218), and producing/procuring a supply of IC wafers (or individual IC dies; see blocks 230 to 234, discussed below).

Figure 5A:
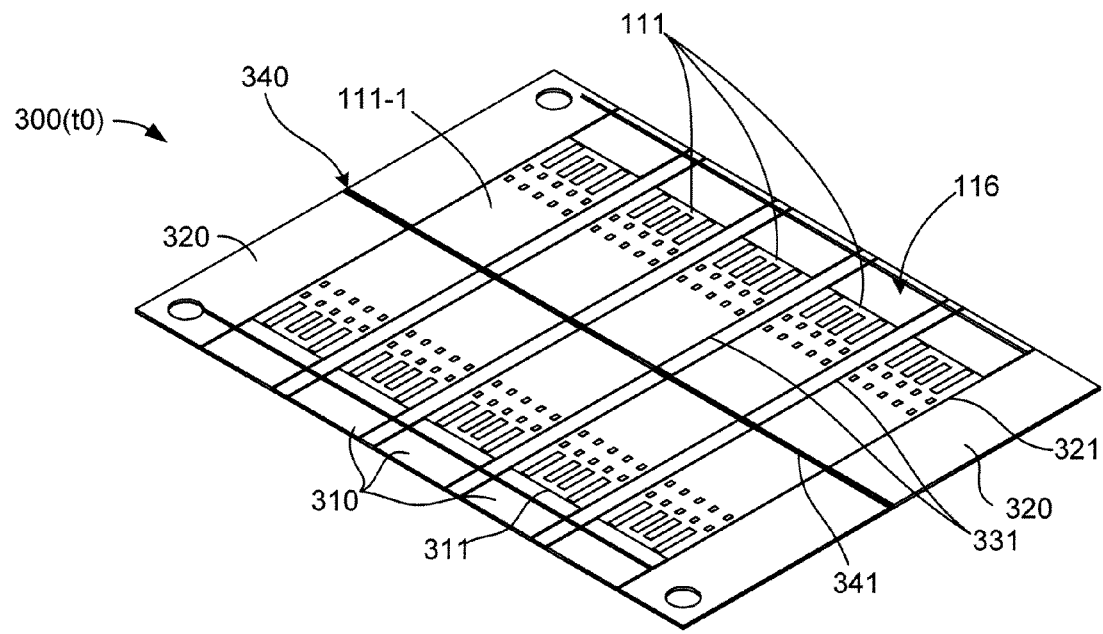
FIGS. 5(A) and 5(B) are top perspective and partial top perspective views showing a PCB panel utilized in the method of FIG. 4.
Figure 5B:
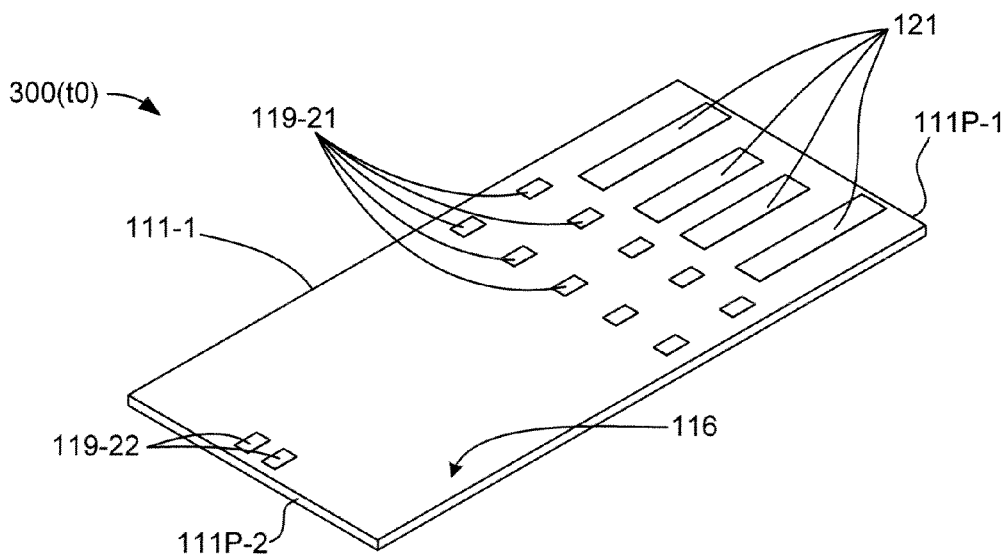
Figure 6A:
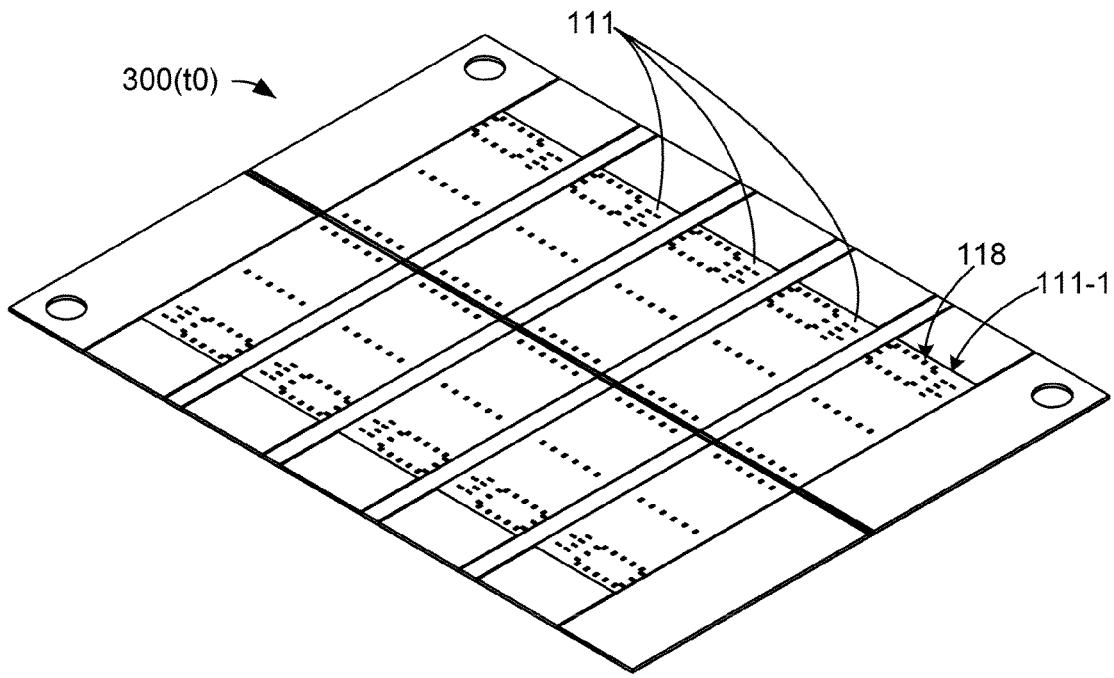
FIGS. 6(A) and 6(B) are bottom perspective and partial bottom perspective views showing the PCB panel of FIG. 5(A)
Figure 6B:
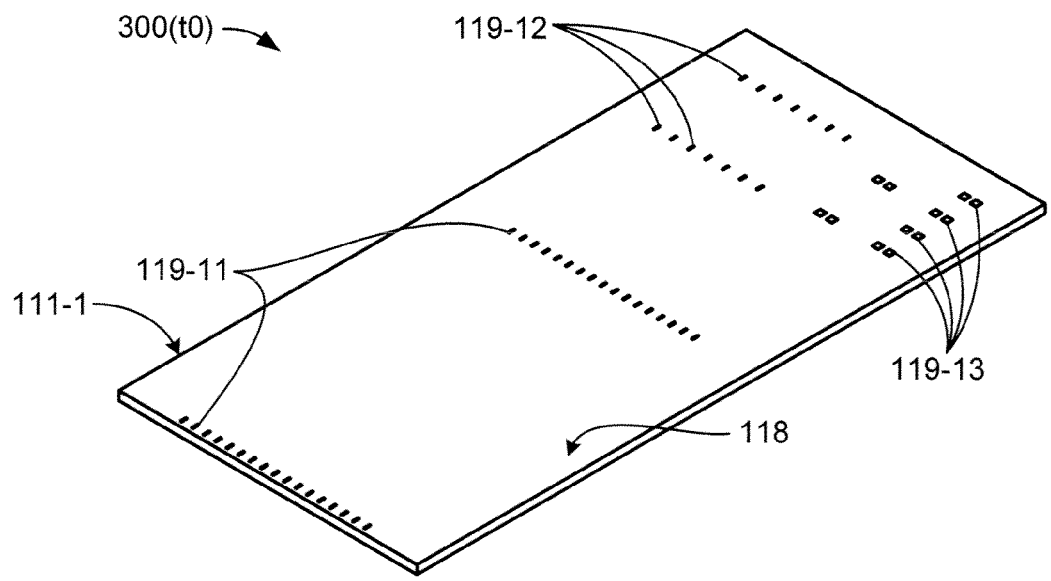

FIG. 5(A) is a top perspective view showing a PCB panel 300(t0) provided in block 210 of FIG. 4 according to a specific embodiment of the present invention. FIG. 5(B) is a top perspective view showing a selected PCB 111-1 of PCB panel 300(t0). FIGS. 6(A) and 6(B) are top perspective views showing panel 300 and selected PCB 111-1, respectively. The suffix "tx" is utilized herein to designated the state of the PCB panel during the manufacturing process, with "t0" designating an initial state. Sequentially higher numbered prefixes (e.g., "t1", "t2" and "t3") indicate that PCB panel 300 has undergone additional processing.

As indicated in FIGS. 5(A) and 6(A), PCB panel 300(t0) includes a two-by-five matrix of regions designated as PCBs 111, each having the features described above with reference to FIG. 3(A). FIGS. 5(A) and 5(B) show upper surface 116 of each PCB 111 (e.g., upper surface 116 of panel 111-1 includes standard USB metal contacts 121, described above), and FIGS. 6(A) and 6(B) show lower surfaces 118 of PCBs 111 (represented by PCB 111-1 in FIG. 6(B)). Note that lower surface 118 of each PCB 111 (e.g., PCB 111-1) includes multiple contact pads 119-11, 119-12 and 119-13 arranged in predetermined patterns for facilitating SMT and COB processes, as described below.

As indicated in FIG. 5(A), in addition to the two rows of PCBs 111, panel 300(t0) includes end border regions 310 and side border regions 320 that surround the PCBs 111, and a central region 340 disposed between the two rows of PCBs 111. Designated cut lines are scored or otherwise partially cut into PCB panel 300(t0) along the borders of each of these regions, but do not pass through the panel material. For example, end cut lines 311 separate end border panels 310 from associated PCBs 111, side cut lines 321 separate side border panels 310 from associated PCBs 111, and central cut lines 341 separate central region 340 from associated PCBs 111. PCB cut lines 331 are formed along the side edges between adjacent PCBs 111. The border panels are provided with positioning holes and other features known to those skilled in the art to facilitate the manufacturing process, and are removed during singulation (described below).

According to an aspect of the invention, each PCB 111 of panel 300(t0) defines a predetermined number of metal I/O contact pads 119-21 and LED contact pads 119-22 that are formed on upper surface 116 (e.g., as depicted in FIG. 5(B)). Metal I/O contact pads 119-21 are in the form of solder pads that are positioned behind standard USB contacts 121 (i.e., as indicated in FIG. 5(B), standard USB contacts 121 are positioned between I/O contact pads 119-21 and front edge 111P-1 of PCB substrate 111-1). As discussed below I/O contact pads 119-21 are utilized in the mounting of contact springs. Similarly, LED contact pads 119-22 are formed on upper surface 116 in the form of solder pads that are positioned adjacent to rear edge 111P-2 of PCB substrate 111-1, and are utilized in the mounting of an LED light.

Note that PCBs for USB memory cards that are produced using SMT-only manufacturing processes must be significantly wider than PCBs 111 due to the space required to mount already packaged flash memory devices. By utilizing COB methods to mount the flash memory, the present invention facilitates significantly narrower PCBs 111, thereby allowing each PCB panel 300(t0) to include an increased number of PCBs 111 per PCB panel, thereby providing shorter manufacturing times and lower manufacturing costs.

Figure 7A:
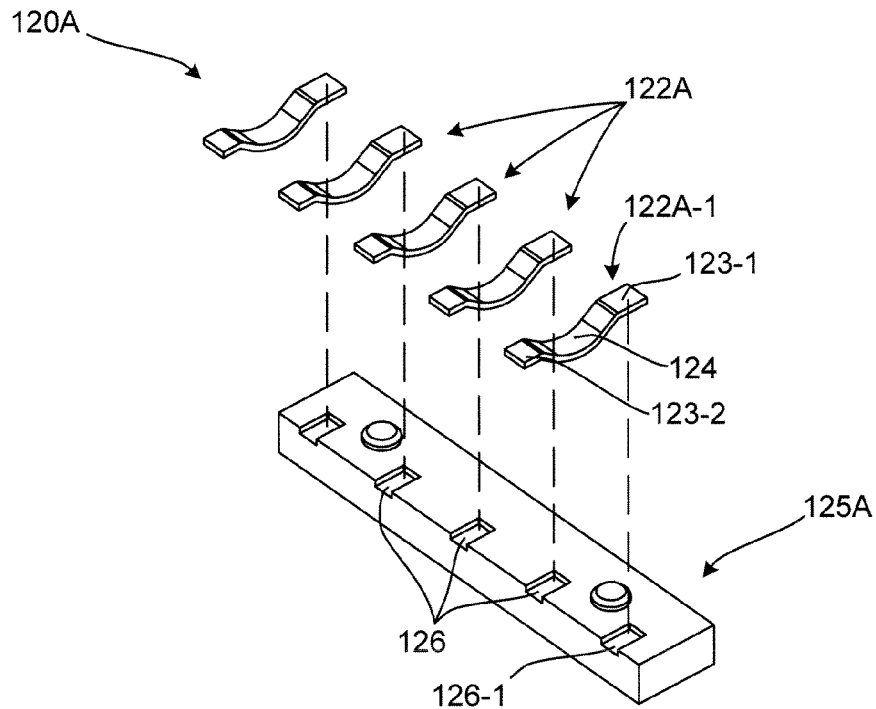
FIGS. 7(A) and 7(B) are an exploded perspective view and an assembled perspective view, respectively, showing a contact spring assembly utilized in the method of FIG. 4 according to an embodiment of the present invention.

FIGS. 7(A) to 10(B) illustrate the assembly and mounting of spring assemblies onto PCB panel 300(t0) according to an embodiment of the invention. FIGS. 7(A) and 7(B) are exploded perspective and perspective views depicting the formation of a spring assembly 120A according to an embodiment of the present invention. Spring assembly 120A includes five substantially C-shaped contact springs 122A, each having a first base portion 123-1 that is secured inside a corresponding groove 126 formed in a guide block 125A, a central contact portion 124 that forms an arched (bent) structure extending from first base portion 123-1, and a second base portion 123-2 that is held away from guide block 125A.

Figure 7B:
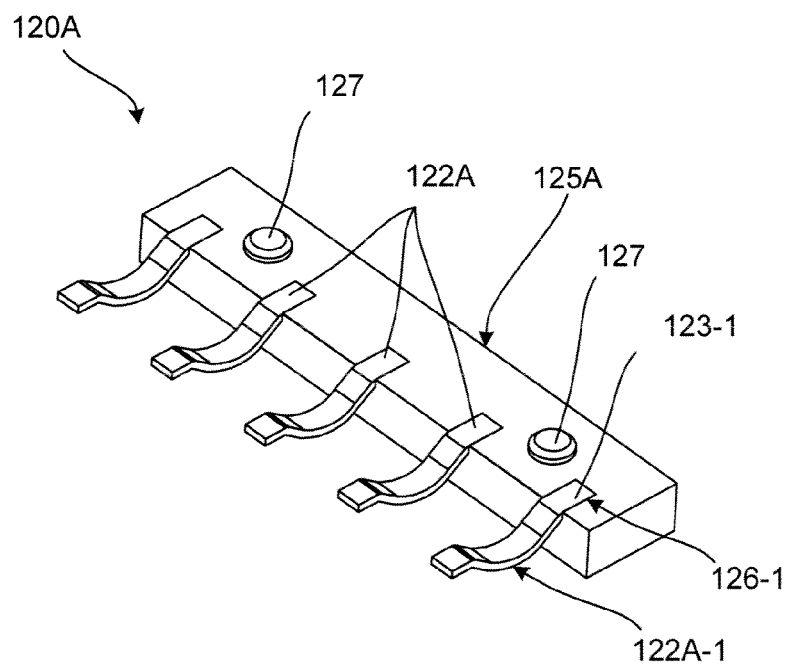

For example, as indicated in FIGS. 7(A) and 7(B), spring 122A-1 has a first base portion 123-1 that is secured inside a corresponding groove 126-1, a central contact portion 124-1, and a second base portion 123-2 that is held away from guide block 125A when spring is secured as shown in FIG. 7(B). In one embodiment, guide block 125A is plastic or another non-conducting material, and contact springs 122A are secured by plastic molding or press-fitting to guide block 125A in a pattern and spacing that precisely matches the pattern of I/O contact pads 119-21. In one embodiment, both base portions 123-1 and 123-2 are coated with low temperature (i.e., approximately 160° C.) lead-free solder, and guide block 125A has on a lower surface thereof adhesive tape of high temperature resistance type (i.e., able to sustain temperatures greater than 180° C.). As shown in FIG. 7(B), integral alignment knobs (protrusions) 127 extend from a lower surface of guide block 125A.

Figure 8:
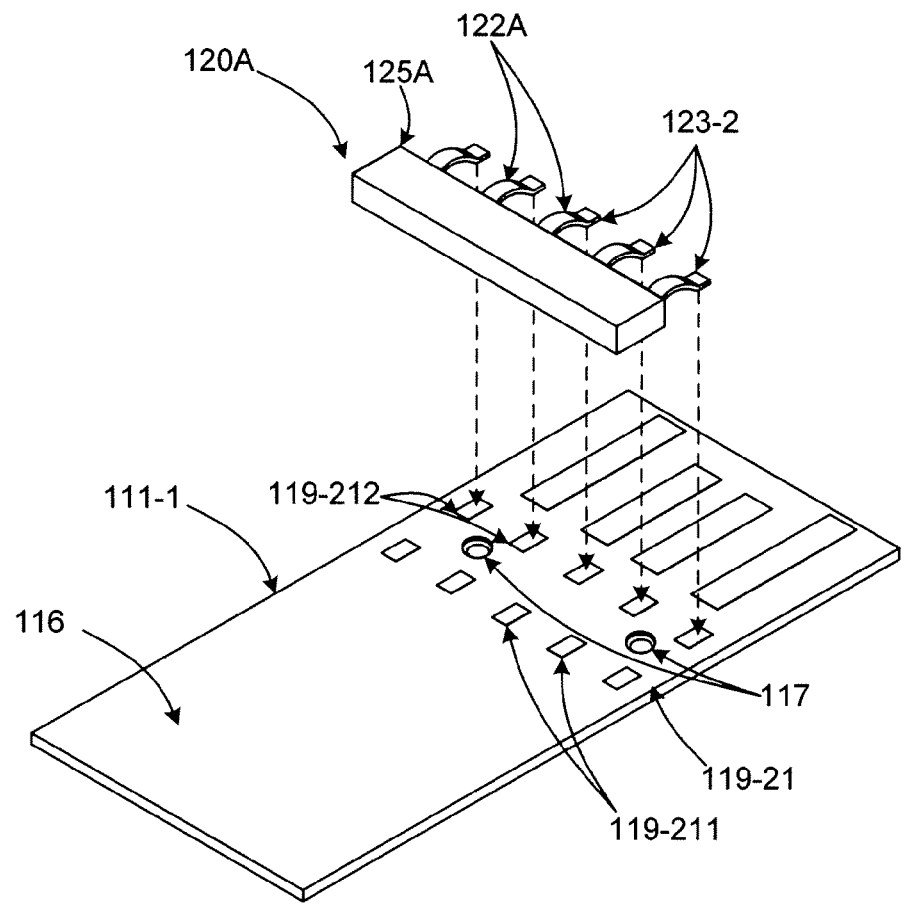
FIG. 8 is an exploded top perspective view depicting mounting of the contact spring assembly of FIG. 7(B) onto the PCB panel of FIG. 5(A) according to an embodiment of the present invention.
Figure 9:
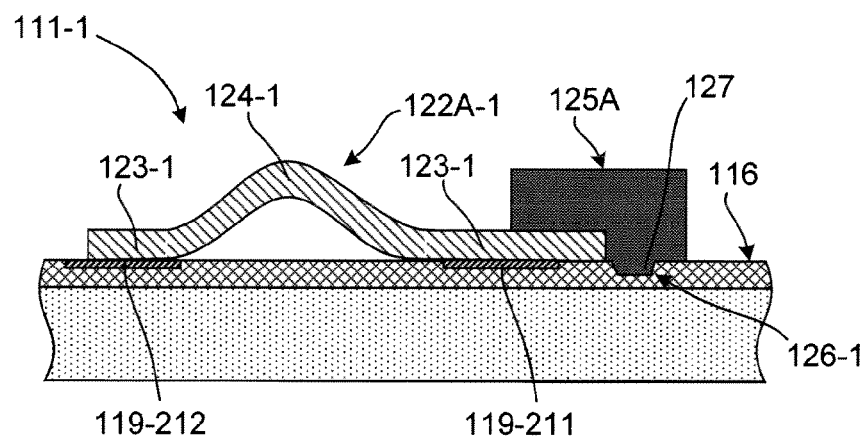
FIG. 9 is a cross-sectional side view showing a portion of the PCB panel of FIG. 5(A) with the contact spring assembly of FIG. 7(B) mounted thereon.
Figure 10A:
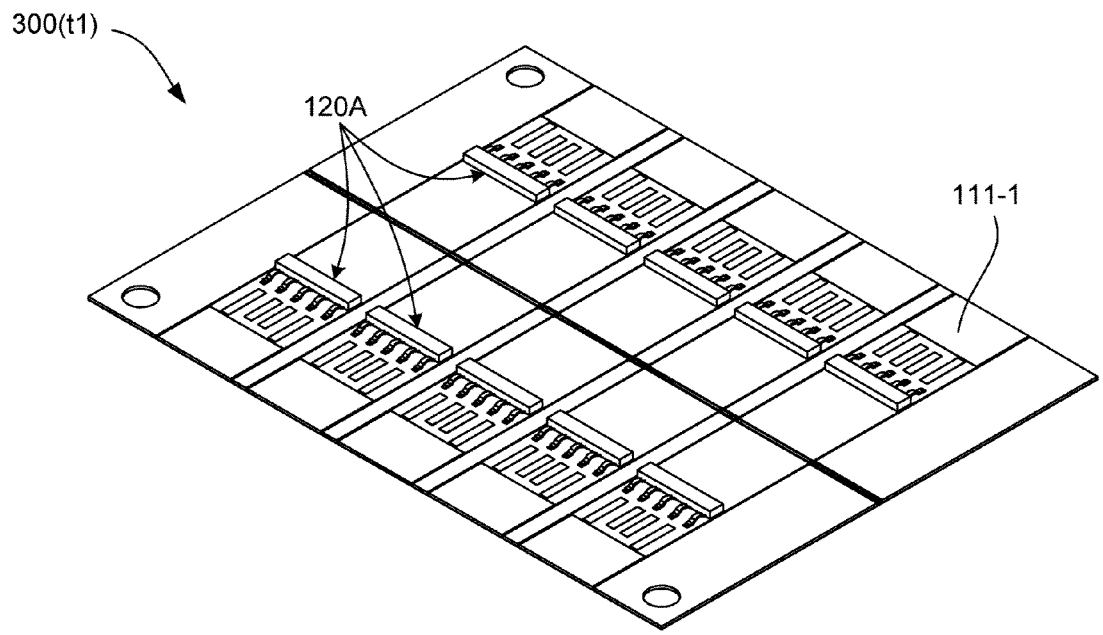
FIGS. 10(A) and 10(B) are top perspective and partial top perspective views showing the PCB panel of FIG. 5(A) after the contact spring assembly of FIG. 7(B) is mounted thereon.
Figure 10B:
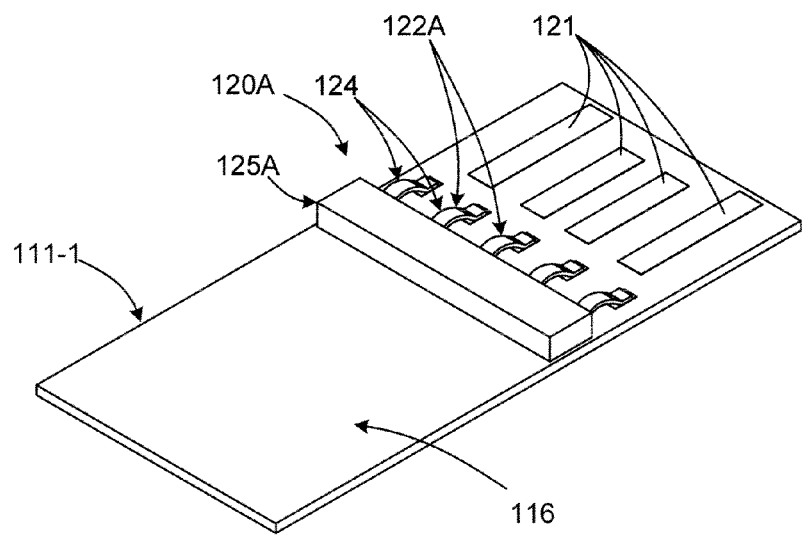

FIGS. 8 and 9 are perspective top and cross-sectional side views illustrating the subsequent process of mounting spring assembly 120A onto PCB 111-1 of PCB panel 300(t0) (shown in FIG. 6(B)). As indicated in FIG. 8 by the vertical dashed-line arrows, spring assembly 120A is aligned and mounted such that base portions 123-2 make contact with a front row of I/O contact pads 119-21 (i.e., contact pads 119-212). In a similar manner, as indicated in FIG. 9, base portions 123-2 are contacted against I/O contact pads 119-21 disposed in a back row of (i.e., contact pads 119-212, indicated in FIG. 8). In addition, as shown in FIG. 8, each alignment knob 127 is received inside a corresponding alignment hole 117 defined in upper surface 116 of PCB 111-1. To facilitate the transfer of signals between contact springs 122A and the subsequently-mounted IC dies, each contact spring 122A is electrically connected to an associated conductive trace (not shown) formed on PCB 111-1 that communicated between I/O contact pads 119-21 and dual-personality IC 131. Contact pads 119-21 are soldered to each base portion 123-1 and 123-2 of each contact spring 122A. As indicated in FIGS. 10(A) and 10(B), after spring assemblies 120A onto PCB (e.g., 111-1) of PCB panel 300(t1), contact portions 124 of each contact spring 122A is maintained in a precise position above upper surface 116 by guide block 125A to enable EUSB operations.

Figure 11A:
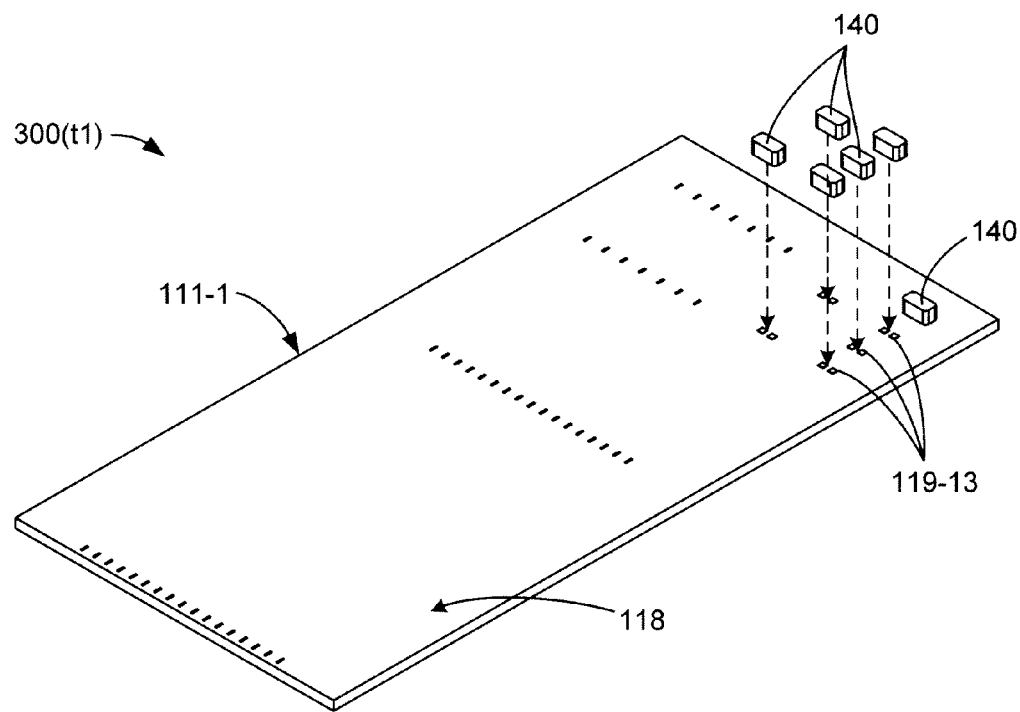
FIGS. 11(A) and 11(B) are partial bottom perspective and bottom perspective views showing the PCB panel of FIG. 10(A) during a subsequent SMT process according to an embodiment of the present invention.
Figure 11B:
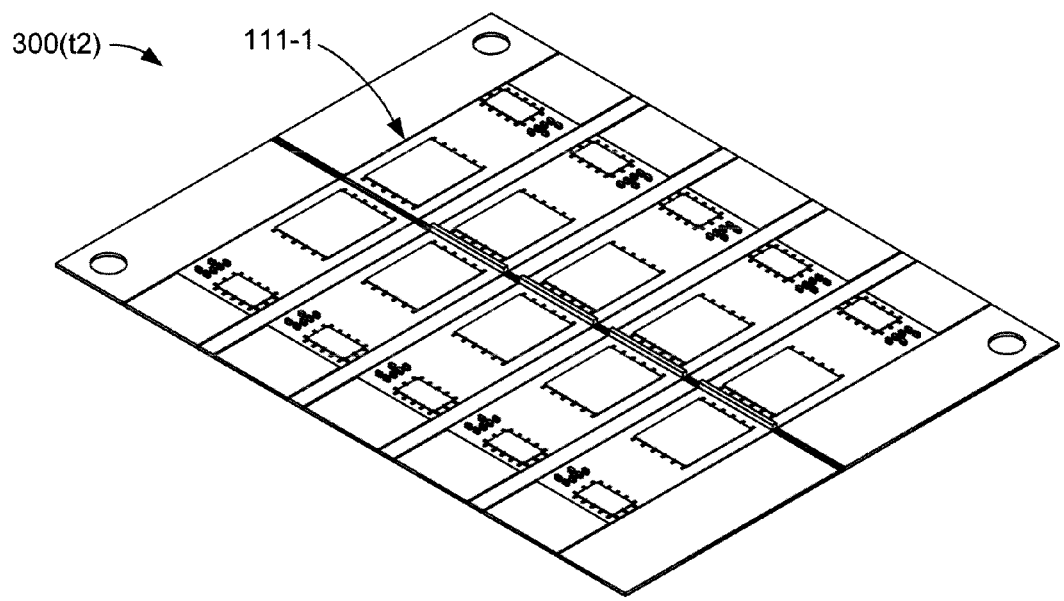

FIG. 11(A) is a perspective view depicting a portion of panel 300(t1) that is used to mount passive components on PCB 111-1 according to block 225 of FIG. 4. During the first stage of the SMT process, lead-free solder paste is printed on contact pads 119-13, which in the present example correspond to SMT components 140, using custom made stencil that is tailored to the design and layout of PCB 111-1. After dispensing the solder paste, the panel is conveyed to a conventional pick-and-place machine that mounts each SMT component 140 onto a corresponding pair of contact pads 119-13 according to known techniques. Upon completion of the pick-and-place component mounting process, the PCB panel is then passed through an IR-reflow oven set at the correct temperature profile. The solder of each pad on the PC board is fully melted during the peak temperature zone of the oven, and this melted solder connects all pins of the passive components to the finger pads of the PC board. FIG. 11(B) shows PCB 111-1 of the resulting PCB panel 300(t2), which now includes passive components 140 mounted thereon by the completed SMT process.

Figure 12A:
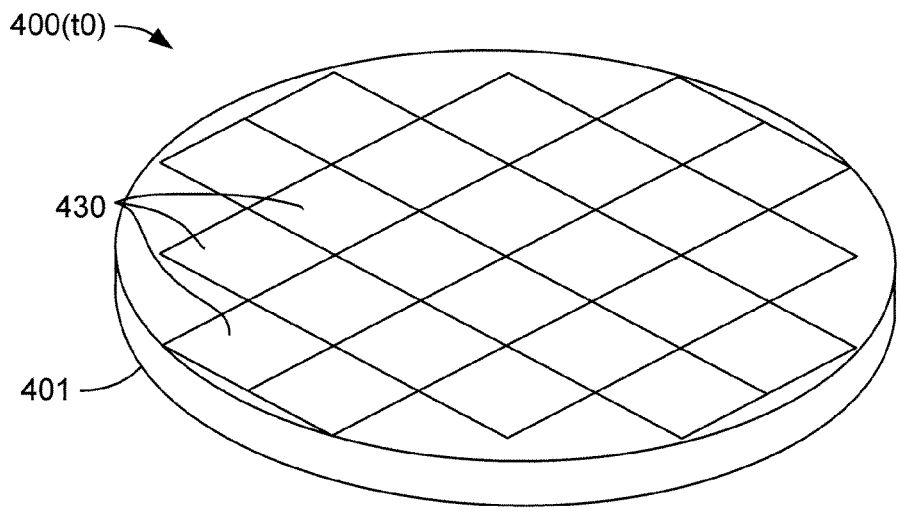
FIGS. 12(A), 12(B), 12(C) and 12(D) are simplified perspective and cross-sectional side views depicting a semiconductor wafer and a process of grinding and dicing the wafer to produce IC dies utilized in the method of FIG. 4.

FIG. 12(A) is a simplified perspective view showing a semiconductor wafer 400(t0) procured or fabricated according to block 230 of FIG. 4. Wafer 400(t0) includes multiple ICs 430 that are formed in accordance with known photolithographic fabrication (e.g., CMOS) techniques on a semiconductor base 401. In the example described below, wafer 400(t1) includes ICs 430 that comprise, e.g., dual-personality communication ICs. In a related procedure, a wafer (not shown) similar to wafer 400(t1) is produced/procured that includes flash memory circuits, and in an alternative embodiment (described in additional detail below), ICs 430 may include both dual-personality communication ICs and flash memory circuits. In each instance, these wafers are processed as described herein with reference to FIGS. 12(B), 12(C) and 12(D).

Figure 12B:
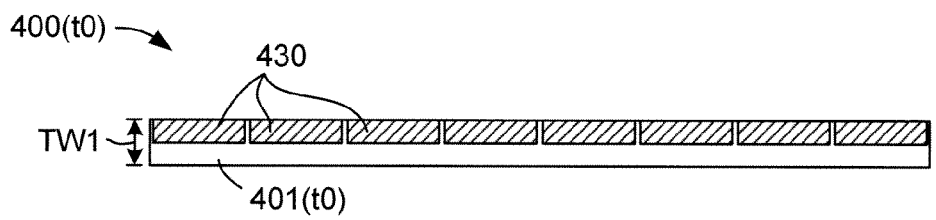
Figure 12C:
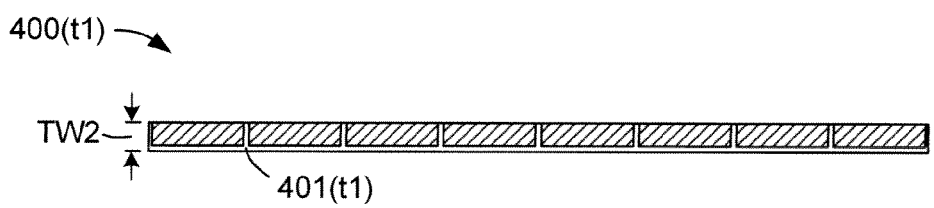

As indicated in FIGS. 12(B) and 12(C), during a wafer back grind process according to block 232 of FIG. 4, base 401 is subjected to a grinding process in order to reduce the overall initial thickness TW1 of each IC 430. Wafer 400(t1) is first mount face down on sticky tape (i.e., such that base layer 401(t0) faces away from the tape), which is pre-taped on a metal or plastic ring frame (not shown). The ring-frame/wafer assembly is then loaded onto a vacuum chuck (not shown) having a very level, flat surface, and has diameter larger than that of wafer 400(t0). The base layer is then subjected to grinding until, as indicated in FIG. 12(C), wafer 400(t1) has a pre-programmed thickness TW2 that is less than initial thickness TW1 (shown in FIG. 12(B)). The wafer is cleaned using de-ionized (DI) water during the process, and wafer 400(t1) is subjected to a flush clean with more DI water at the end of mechanical grinding process, followed by spinning at high speed to air dry wafer 400(t1).

Figure 12D:
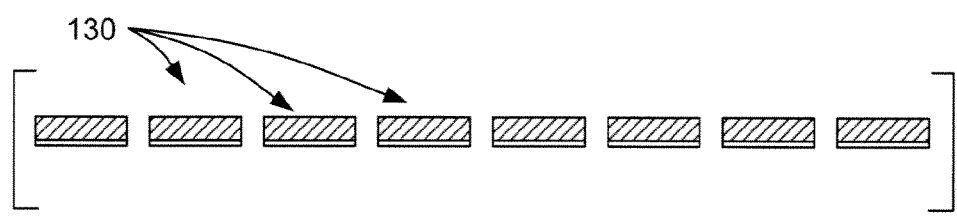

Next, as shown in FIG. 12(D), the wafer is diced (cut apart) along predefined border regions separating ICs 430 in order to produce IC dies 130 according to block 234 of FIG. 4. After the back grind process has completed, the sticky tape at the front side of wafer 400(t1) is removed, and wafer 400(t1) is mounted onto another ring frame having sticky tape provided thereon, this time with the backside of the newly grinded wafer contacting the tape. The ring framed wafers are then loaded into a die saw machine. The die saw machine is pre-programmed with the correct die size information, X-axis and Y-axis scribe lanes' width, wafer thickness and intended over cut depth. A proper saw blade width is then selected based on the widths of the XY scribe lanes. The cutting process begins dicing the first lane of the X-axis of the wafer. De-ionized wafer is flushing at the proper angle and pressure around the blade and wafer contact point to wash and sweep away the silicon saw dust while the saw is spinning and moving along the scribe lane. The sawing process will index to the second lane according to the die size and scribe width distance. After all the X-axis lanes have been completed sawing, the wafer chuck with rotate 90 degree to align the Y-axis scribe lanes to be cut. The cutting motion repeated until all the scribe lanes on the Y-axis have been completed.

Figure 13A:
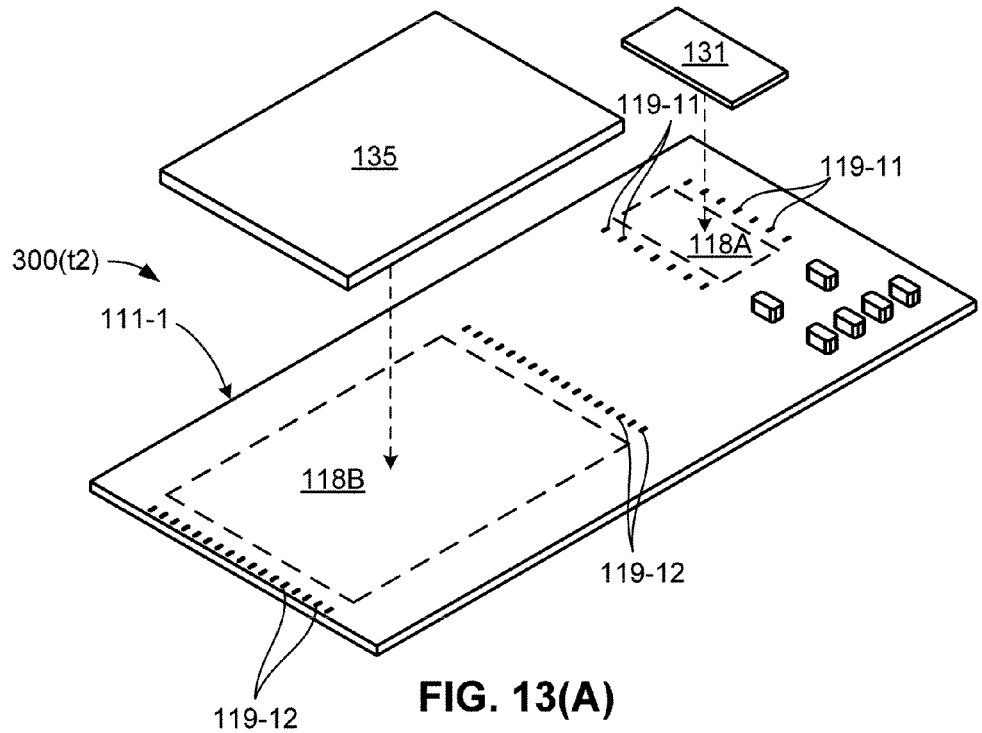
FIGS. 13(A) and 13(B) are partial bottom perspective and bottom perspective views depicting a die bonding process utilized to mount the IC dies of FIG. 12(D) onto the PCB panel of FIG. 11(B) according to the method of FIG. 4.
Figure 13B:
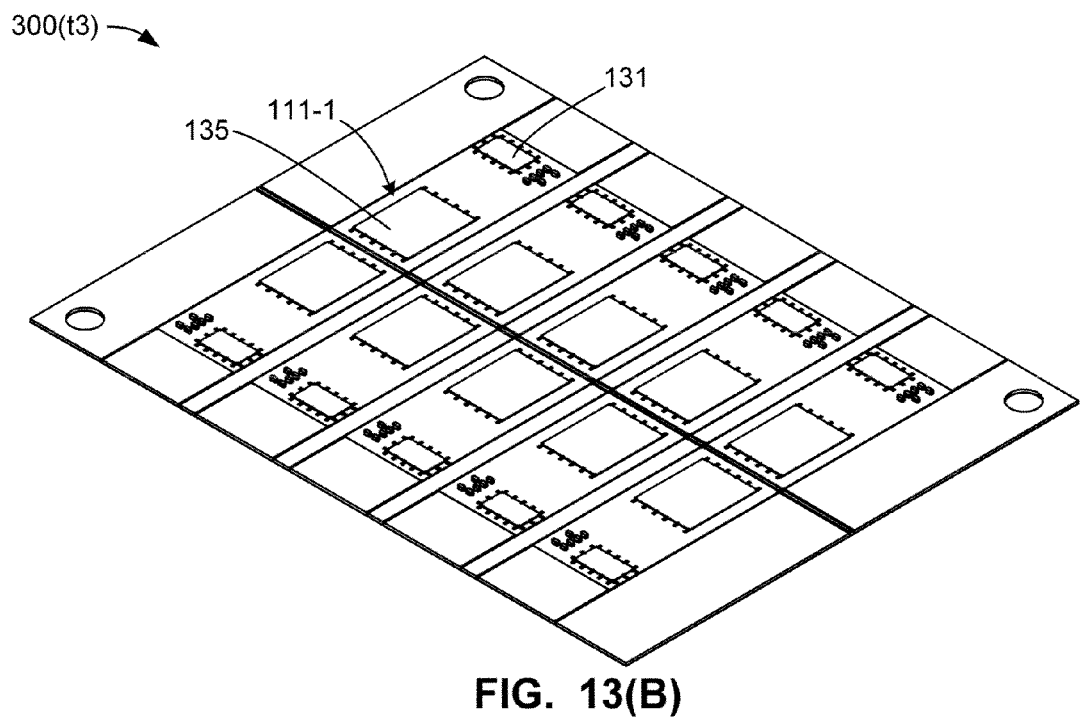

FIG. 13(A) is a perspective view depicting a die bonding process utilized to mount IC dies 131 and 135 on PCB 111-1 of the PCB panel 300(t2) (described above with reference to FIG. 11(B)) according to block 240 of FIG. 5. The die bonding process generally involves mounting IC dies 131 into lower surface region 118A, which is surrounded by contact pads 119-11, and mounting IC die 135 into lower surface region 118B, which is surrounded by contact pads 119-12. In one specific embodiment, an operator loads IC dies 131 and 135 onto a die bonder machine according to known techniques. The operator also loads multiple PCB panels 300(t2) onto the magazine rack of the die bonder machine. The die bonder machine picks the first PCB panel 300(t2) from the bottom stack of the magazine and transports the selected PCB panel from the conveyor track to the die bond (DB) epoxy dispensing target area. The magazine lowers a notch automatically to get ready for the machine to pick up the second piece (the new bottom piece) in the next cycle of die bond operation. At the die bond epoxy dispensing target area, the machine automatically dispenses DB epoxy, using pre-programmed write pattern and speed with the correct nozzle size, onto the target areas 118A and 118B of each of the PCB 111 of PCB panel 300(t2). When all PCBs 111 have completed this epoxy dispensing process, the PCB panel is conveyed to a die bond (DB) target area. Meanwhile, at the input stage, the magazine is loading a second PCB panel to this vacant DB epoxy dispensing target area. At the die bond target area, the pick up arm mechanism and collet (suction head with rectangular ring at the perimeter so that vacuum from the center can create a suction force) picks up an IC die 131 and bonds it onto area 118A, where epoxy has already dispensed for the bonding purpose, and this process is then performed to place IC die 135 into region 118B. Once all the PCB boards 111 on the PCB panel have completed die bonding process, the PCB panel is then conveyed to a snap cure region, where the PCB panel passes through a chamber having a heating element that radiates heat having a temperature that is suitable to thermally cure the epoxy. After curing, the PCB panel is conveyed into the empty slot of the magazine waiting at the output rack of the die bonding machine. The magazine moves up one slot after receiving a new panel to get ready for accepting the next panel in the second cycle of process. The die bonding machine will repeat these steps until all of the PCB panels in the input magazine are processed. This process step may repeat again for the same panel for stack die products that may require to stacks more than one layer of memory die. FIG. 13(B) is a top perspective views showing PCB 111-1 of PCB panel 300(t3) after the die bonding process is completed.

Figure 14A:
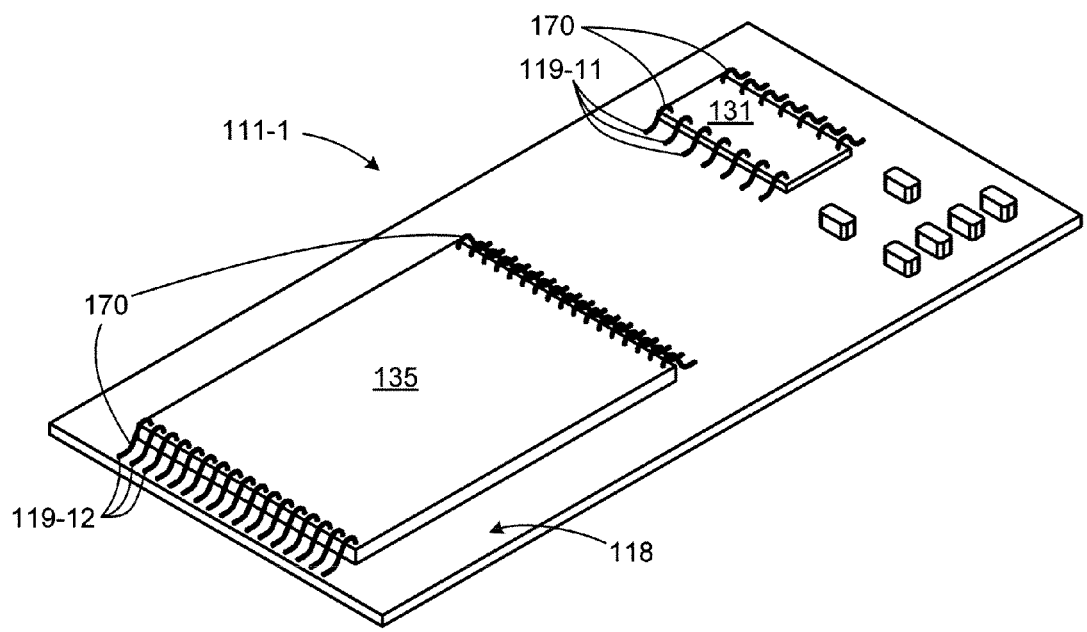
FIGS. 14(A) and 14(B) are partial bottom perspective and bottom perspective views depicting a wire bonding process utilized to connect the IC dies to corresponding contact pads disposed on the PCB of FIG. 13(B) according to the method of FIG. 4.
Figure 14B:
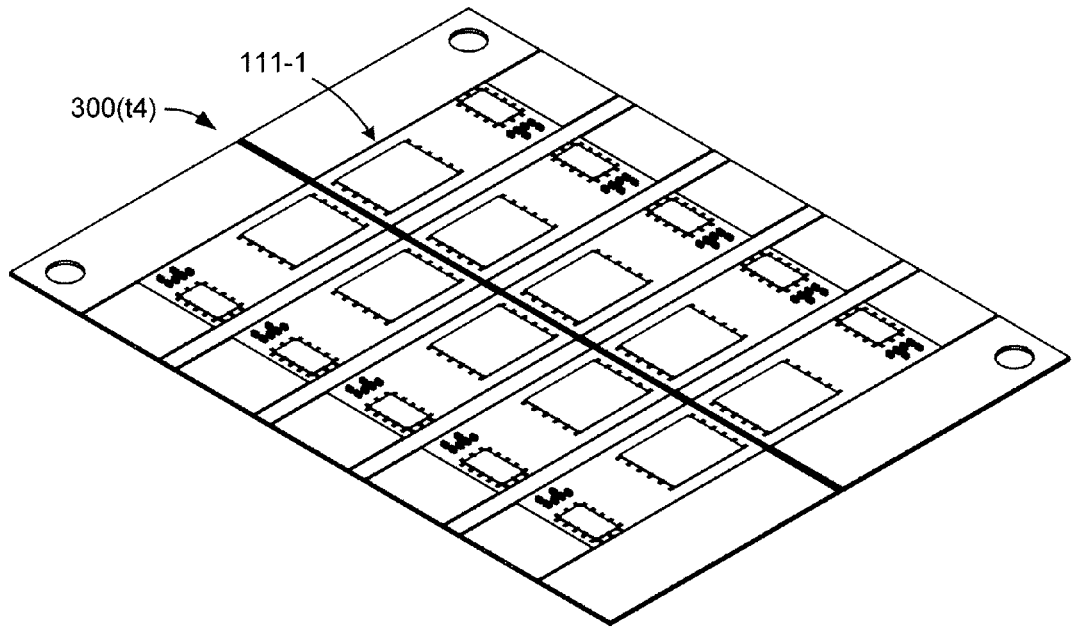

FIG. 14(A) is a perspective view depicting a wire bonding process utilized to connect the IC dies 131 and 135 to corresponding contact pads 119-11 and 119-12, respectively, according to block 245 of FIG. 4. The wire bonding process proceeds as follows. Once a full magazine of PCB panels 300(t3) (see FIG. 13(B)) has completed the die bonding operation, an operator transports the PCB panels 300(t3) to a nearby wire bonder (WB) machine, and loads the PCB panels 300(t3) onto the magazine input rack of the WB machine. The WB machine is pre-prepared with the correct program to process this specific EUSB device. The coordinates of all the ICs pads 119-11 and 119-12 and PCB gold fingers were previously determined and programmed on the WB machine. After the PCB panel with the attached dies is loaded at the WB bonding area, the operator commands the WB machine to use optical vision to recognize the location of the first wire bond pin of the first memory die of the first PCB on the panel. Once the first pin is set correctly, the WB machine can carry out the whole wire bonding process for the rest of the panels of the same product type automatically. For multiple flash layer stack dies, the PCB panels may be returned to the WB machine to repeat wire bonding process for the second stack. FIG. 14(B) is a top perspective views showing PCB panel 300(t4) after the wire bonding process is completed, and indicates completed wire bonds 170 connected to ICs 131 and 135.

Figure 15:
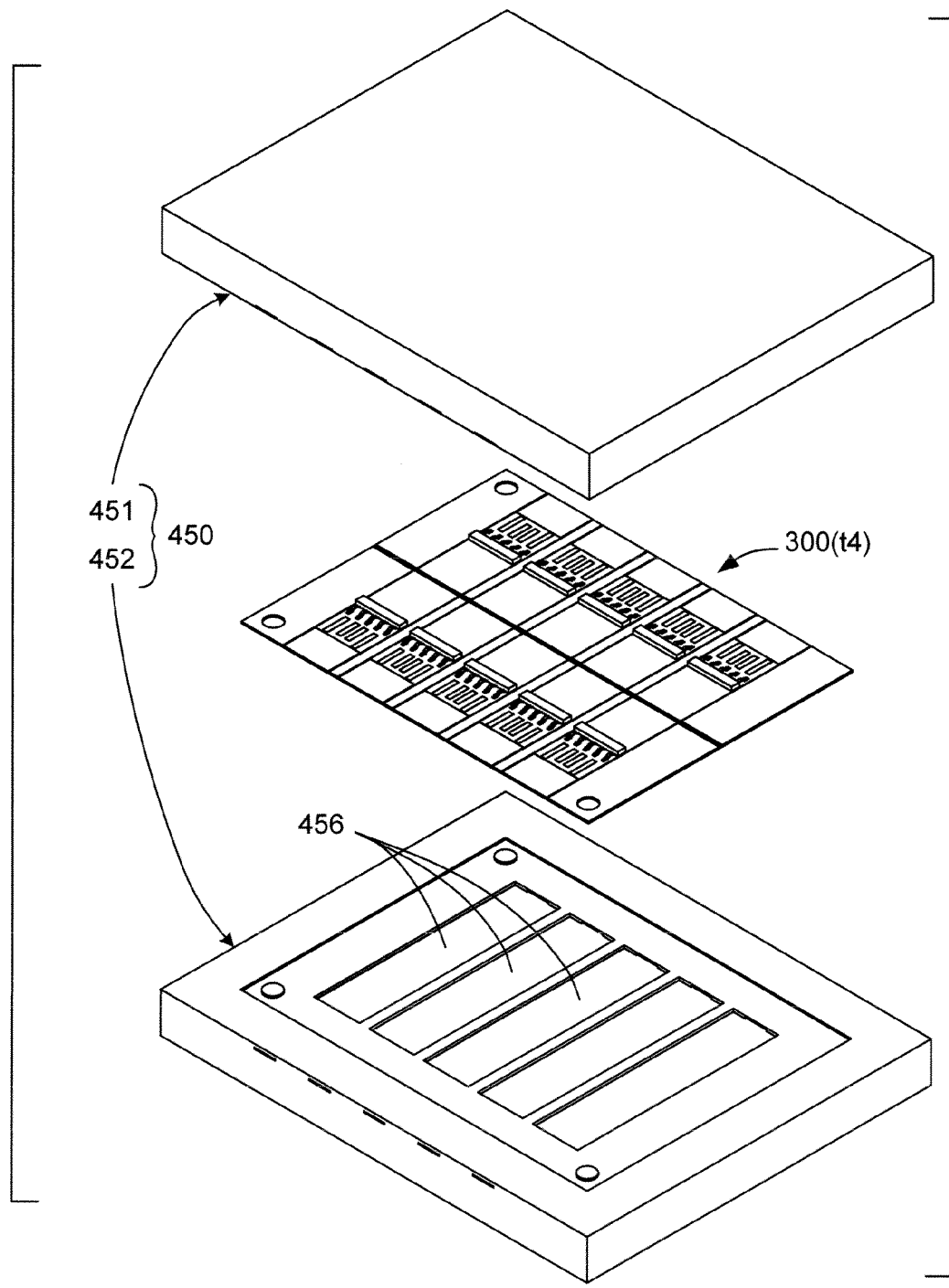
FIG. 15 is an exploded perspective view showing an exemplary molding die assembly utilized to the perform single shot molding process in accordance with the method of FIG. 4.

FIG. 15 is an exploded perspective top view showing a top cover plate (upper molding die) 451 and bottom cover plate (lower molding die) 452 of a mold machine 450 utilized to perform a single-shot molding process according to an embodiment of the present invention. FIGS. 16 and 17 are simplified cross-sectional side views depicting a molding process for forming a molded housing layer over PCB panel 300(t4) using mold machine 450 according to block 250 of FIG. 4.

As indicated in FIG. 16, after the wire bonding process is completed, USB panel 300(t4) is loaded into mold machine 450 between top cover plate 451 and bottom cover plate 452. Top cover plate 451 mounts over upper surface 116 of PCB panel 300(t4) and defines cavities 453 that receive and prevent damage to contact pads 121, guide block 125A, springs 122A, and LED lights 160. Note that cavity 453 is entirely isolated from plastic flow during the molding process. In contrast, as shown in FIG. 15, bottom cover plate 452 mounts over lower surface 118 of PCB panel 300(t4), and defines cavities 456 that respectively enclose the IC chips, wire bonds and passive components that are mounted on lower surface 118 of each PCB.

Figure 18:
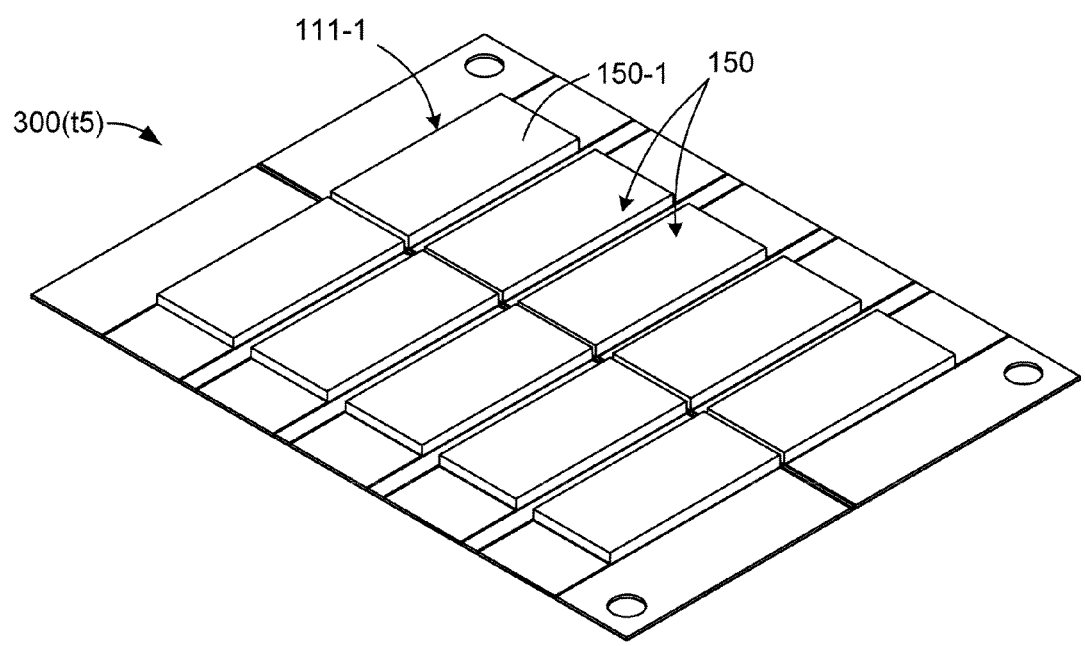
FIG. 18 is a bottom perspective view showing the PCB panel of FIG. 17 after being removed from the molding die assembly.

FIG. 17 depicts a transfer molding process performed after cover plates 451 and 452 are secured over panel 300(t4). Transfer molding is used due to the high accuracy of transfer molding tooling and low cycle time. The molding material in the form of pellet is preheated and loaded into a pot or chamber (not shown). FIG. 17 a plunger (not shown) is used to force the material from the pot through channels known as a spruce and runner system into mold cavity 456, causing the molten (e.g., plastic) material to form molded housing 150 over each PCB that encapsulates all the IC chips and components disposed on lower surface 118. Note that molding material is prevented from entering cavities 453 by the PCB material (i.e., cavities 453 are entirely isolated form the plastic flow), thereby preventing plastic from forming on contact pads 121 and contact springs 122A during the molding process. In this manner, PCB 111 is disposed between the entirety of the plastic material forming housing 150 and upper surface 116. Mold machine 450 remains closed as the material is inserted and filled up all vacant in cavities 456. During the process, the walls of cover plates 451 and 452 are heated to a temperature above the melting point of the mold material, which facilitates a faster flow of material through cavities 456. Mold machine 450 remains closed until a curing reaction within the molding material is complete. A cooling down cycle follows the injection process, and the molding materials of molded casings 450 start to solidify and harden. Ejector pins push PCB panel 300(t5) (shown in FIG. 18) from the mold machine once molded casings 150 have hardened sufficiently over the lower surfaces of the PCBs (e.g., housing 150-1 is solidified on PCB 111-1).

Figure 19:
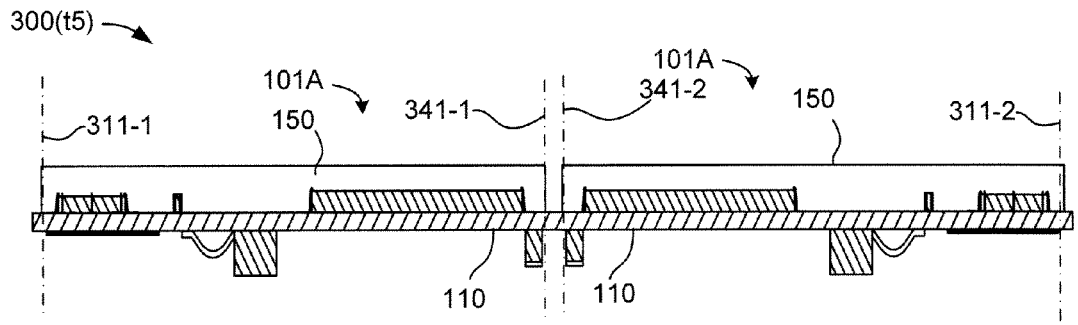
FIG. 19 is a cross-sectional side view showing a singulation process according to the method of FIG. 4.

FIG. 19 is simplified cross-sectional side view depicting a singulation process according to block 260 of FIG. 4 that is used to separate PCB panel 300(t5) into individual sub-assemblies (devices) 101A. PCB panel 300(t5) is loaded into a saw machine (not shown) that is pre-programmed with a singulation routine that includes predetermined cut locations. The saw blade is aligned to the first cut line (e.g., end cut line 311-1) as a starting point by the operator. The coordinates of the first position are stored in the memory of the saw machine. The saw machine then automatically proceeds to cut up (singulate) the USB panel 300(t5), for example, successively along cut lines 311-1, 341-1, 341-2, and 311-2, and then along the side cut lines and PCB cut lines (see FIG. 5(A)) to form EUSB devices 101A, which are shown and described above with reference to FIGS. 3(A) and 3(B), according to the pre-programmed singulation routine.

Figure 20A:
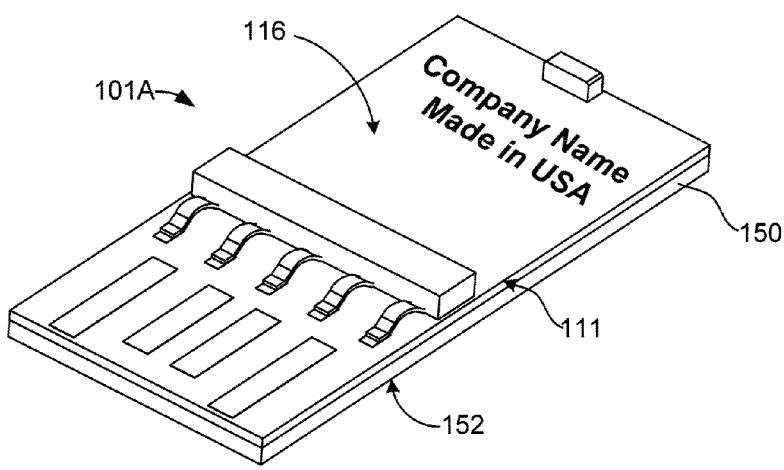
FIGS. 20(A) and 20(B) are top and bottom perspective views showing a EUSB following a marking process according to an embodiment of the present invention.
Figure 20B:
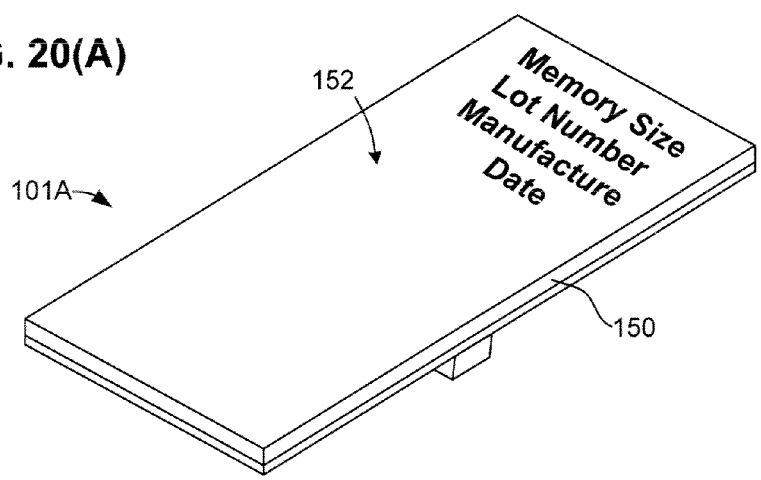

Referring to block 280 located at the bottom of FIG. 4, final procedures in the manufacturing method of the present invention involve optional marking (block 270), testing, packing and shipping the individual extended USB devices. An exemplary marked EUSB device 101A is shown in FIGS. 20(A) and 20(B), including company name and country of manufacture printed on upper surface 116 of PCB 111, and additional information, such as memory size (storage capacity), lot number and manufacturing date printed on lower surface 152 of housing 150. Visually or/and electrically test rejects are removed from the good population as defective rejects. The good extended USB devices are then packed into custom made boxes which are specified by customers. The final packed products will ship out to customers following correct procedures with necessary documents.

Figure 21:
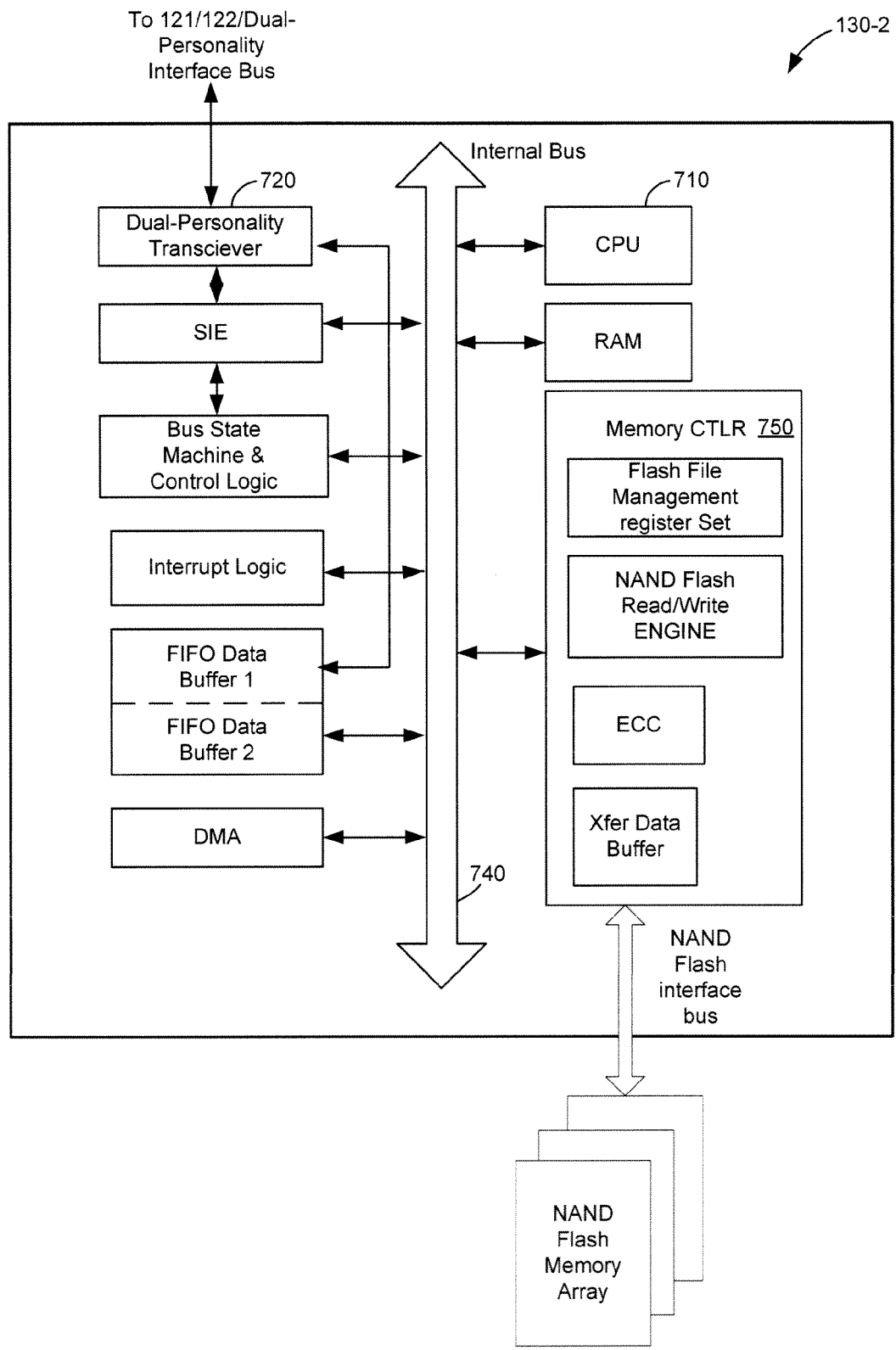
FIG. 21 is a block diagram showing a dual-personality controller circuit of a EUSB device according to an embodiment of the present invention.

FIG. 21 is a block diagram showing a simplified dual-purpose controller 130-2 according to another embodiment of the present invention. CPU 710 communications with a dual-personality transceiver 720 by way of an internal bus 740. Dual-personality transceiver 720 operates in a manner similar to that described above with reference to host system 105 (FIG. 2) to communicate with both standard USB contact pads 121 and extended purpose contact springs 122A in order to communicate with a host system, e.g., by way of socket 190 (see FIG. 2). Note that controller 130-2 includes a memory controller 750 for controlling read/write operations to flash memory circuits that are part of the PCBA hosting dual-purpose controller 130-2, thereby facilitating the dual-personality (i.e., EUSB-type and USB-type) communications that are described above.

Figure 22:
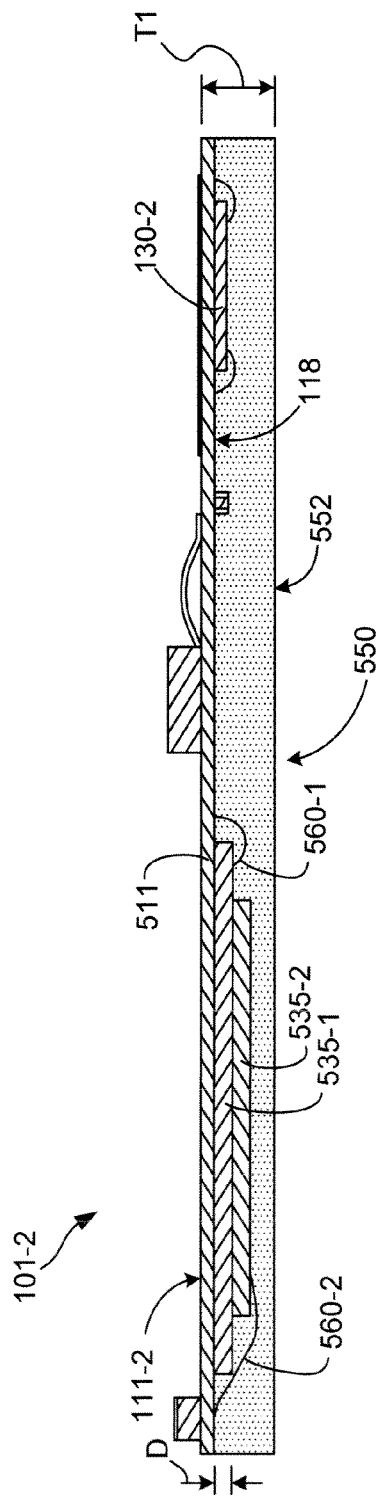
FIG. 22 is simplified cross-sectional side view showing an EUSB device including stacked-memory according to another embodiment of the present invention.

FIG. 22 is simplified cross-sectional side view showing a stacked-memory EUSB device 101-2 in which dual-purpose controller 130-2 accesses a first flash memory chip 535-1 and a second flash memory chip 535-2. First flash memory chip 535-1 is mounted on a lower surface 118 of a PCB 111-2 and connected by first wire bonds 560-1 to PCB 111-2 in the manner described above. Because the IC die height (thickness) D is much smaller than packaged flash memory devices, and because the thickness T1 of EUSB device 101 is set, for example, at 2.0 mm to assure a snug fit of the extended USB device inside a female USB socket (e.g., socket 190, shown in FIG. 1(A)), the present invention facilitates a stacked memory arrangement in which second flash memory die 535-2 is mounted on first flash memory die 535-1 and connected to PCB 111-2 by way of second wire bonds 560-2. In an alternative embodiment (not shown), second flash memory die 535-2 may be connected to contacts provided on first flash memory die 535-1 by associated wire bonds. This stacked memory arrangement greatly increases memory capacity of the extended USB devices without increasing the footprint (i.e., thickness T1, length and width) of EUSB device 101-2. EUSB device 101-2 is then processed and assembled as described above to produce a corresponding completed extended USB device.

Figure 23:
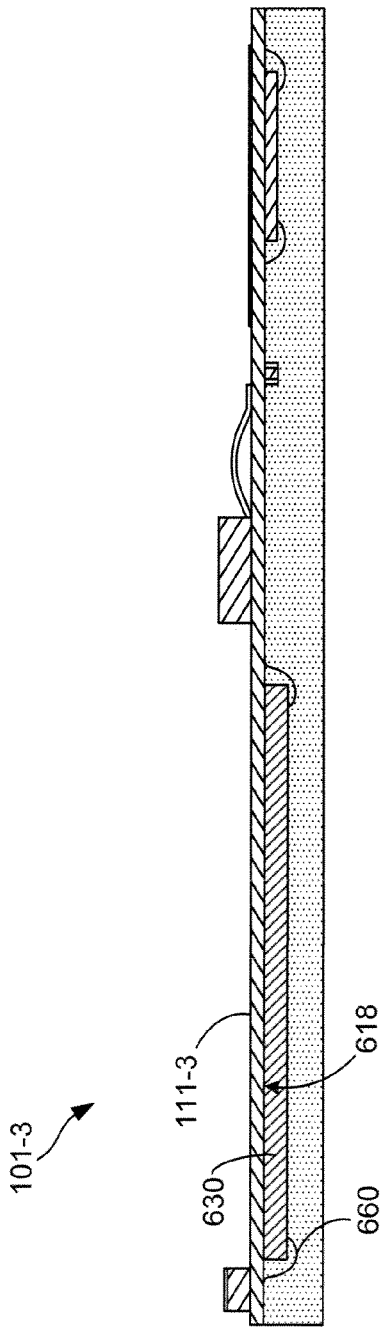
FIG. 23 is simplified cross-sectional side view showing a single-chip EUSB device according to another embodiment of the present invention.

FIG. 23 is simplified cross-sectional side view showing a EUSB device 101-3 including stacked-memory according to another embodiment of the present invention. EUSB device 101-3 is distinguished over the previous embodiments in that, instead of separate controller and flash memory chips, EUSB device 101-3 utilizes a single-chip dual-purpose controller/flash die 630 that is connected to a PCB 111-3 by way of wire bonds 660 in the manner described above, and is characterized in that single-chip dual-purpose controller/flash die 630 includes both a dual-purpose controller circuit and one or more flash block mass storage circuits that are interconnected by a bus.

Although the present invention is described above with reference to a specific EUSB device, the assembly process of the present invention may be utilized to produce other devices as well, some of which are described below with reference to FIGS. 24 to 29.

Figure 24:
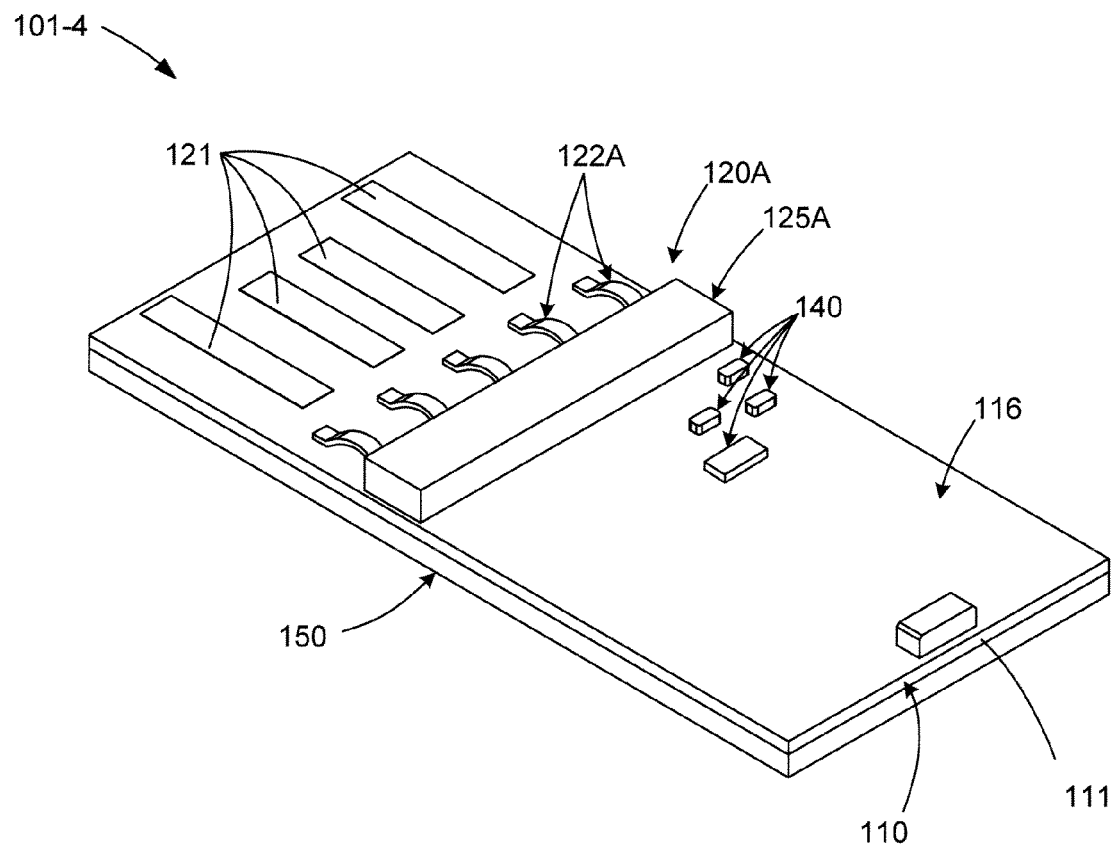
FIG. 24 is a perspective view showing an EUSB device according to another embodiment of the present invention in which passive components are disposed on the top PCB surface.

FIG. 24 is a perspective view showing an EUSB device 101-4 according to another embodiment of the present invention. EUSB device 101-4 is essentially identical to EUSB device 101A (described above) in that it includes contact spring assembly 120A having five springs 122A connected by way of spring guide block 125A to upper surface 116 of PCB 111. EUSB device 101-4 differs from device 101A in that passive components 140, such as resistors, capacitors, and oscillators, are mounted onto associated contact pads disposed on upper surface 116 of PCB 111 using the standard surface mount technology (SMT) process, and are then secured to the contact pads using known solder reflow techniques. Although this approach potentially exposes passive components 140 to damage by locating them outside the protection of housing 150, this technique is effective for reducing device size (i.e., by requiring less space on the lower PCB surface for ICs and components), and the risk of damage may be mitigated by utilizing EUSB device 101-4 as a modular structure in an assembly including an additional external housing, such as that described below with reference to FIGS. 25(A) and 25(B).

Figure 25A:
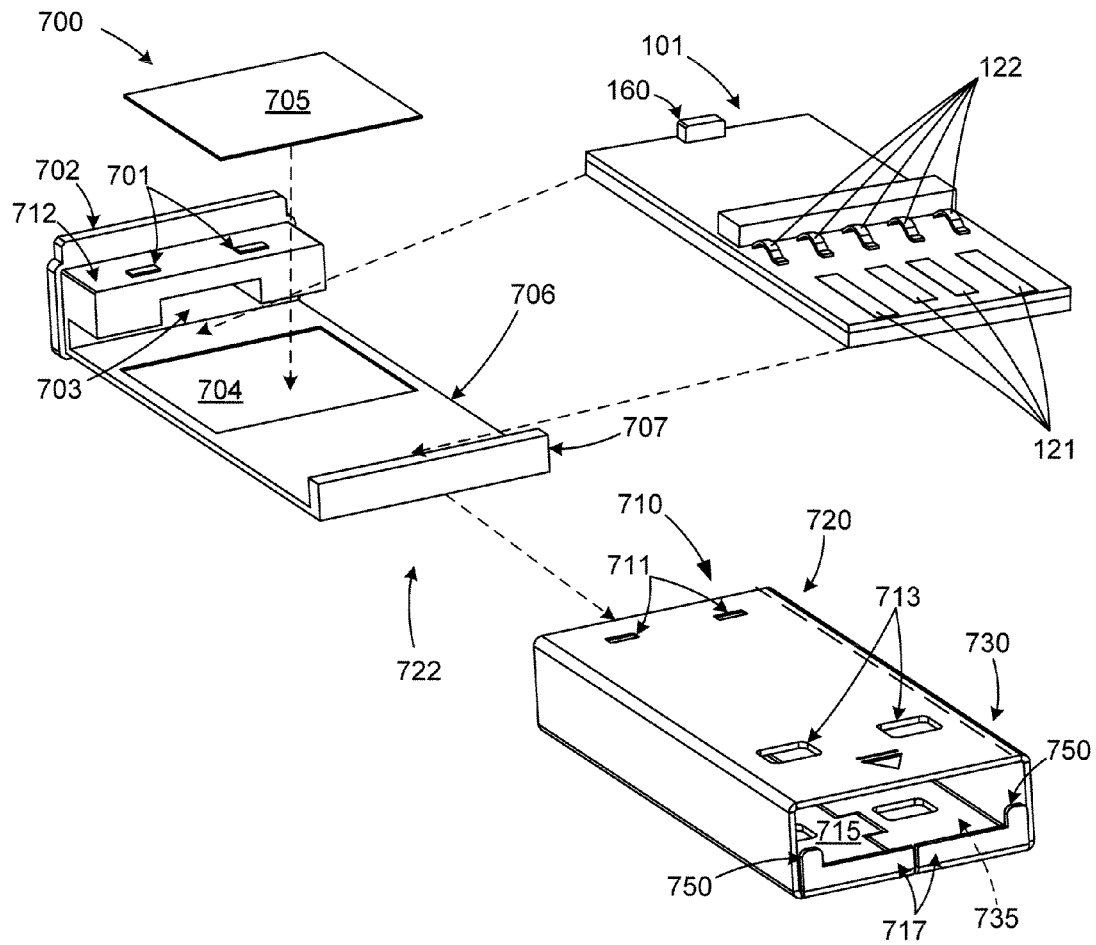
FIGS. 25(A) and 25(B) are exploded perspective and assembled perspective views showing an EUSB assembly according to another embodiment of the present invention.
Figure 25B:
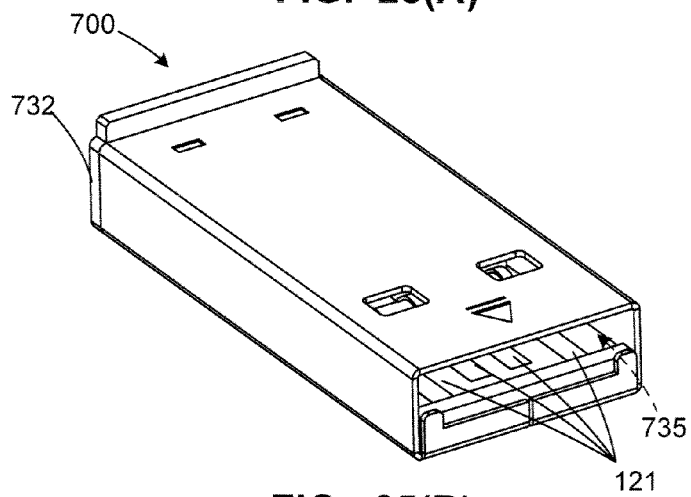

FIGS. 25(A) and 25(B) are exploded perspective and assembled perspective views, respectively, depicting an Extended Universal-Serial-Bus (EUSB) assembly 700 according to another specific embodiment that utilizes any of the EUSB devices described above (indicated in FIG. 25(A) as EUSB device 101) as a modular structure that is fixedly connected inside an external rectangular plastic or metal tube housing (case) 710 by way of a carrier structure 706 such that, as indicated in FIG. 25(B), metal contacts 121 of EUSB device 101 are accessible through a front opening 735 defined a standard USB plug shell 730 formed at a front end of case 710.

Referring to FIG. 25(A), case 710 is a rectangular plastic or metal tube-like structure having a rear handle section 720 and front plug shell 730, and defining an elongated internal cavity 715 extending from a backside opening at the end of handle section 720 to front opening 735 defined by plug shell 730. Case 710 includes two notches 711, two top holes 713 and two matching bottom holes (not shown), and two folded-up gate plates 717. Notches 711 are used to secure carrier structure 706 as described below. Holes 713 and the two bottom holes serve to hold the EUSB device in place when plug shell 730 is inserted into a host socket. Folded-up gate plates 717 include tabs 750 extending upward that serve to prevent EUSB device 101 from slipping out of front opening 735 after assembly.

Substrate carrier 706 serves to support EUSB device 101, and is sized to slide into case 710 through its rear opening. Carrier 706 includes a U-block 712, recesses (or depressions) 701, a back plate 702, a cavity hole 703, a rectangular depression 704 for receiving a tape portion 705, and a front block 707. U-block 712 is mounted on back plate 702 and is shaped to receive and secure a rear end of EUSB device 101, and includes cavity hole 703 to receive LED light 160. Recesses 701 are positioned on the top surface of U-block 712 and serve to snap-couple with respective notches 711 of case 710. Front block 707 secures the front edge of EUSB device 101 to carrier 706 and protects the front edge from damage during assembly.

EUSB assembly 700 is assembled by first forming a sub-assembly 722 including EUSB device 101 and carrier 706, and then inserting sub-assembly 722 into case 710. In one embodiment, tape portion 705 is placed in depression 704, EUSB device 101 is mounted onto carrier 706 by placing its rear edge into the slot defined below U-block 712, and then pressing the front edge into the space behind front block 707, thereby completing sub-assembly 722. In one embodiment, tape portion 705 is a thermal set adhesive tape portion, and sub-assembly 722 is heated to activate thermal set adhesive tape, thereby thermally securing EUSB device 101 to carrier substrate 706. In another embodiment, tape portion 705 is a double-sided adhesive tape portion that does not require heat to activate. Next, sub-assembly 722 is inserted front-first through the rear opening of case 710, and slid forward until front block 707 abuts folded-up gate plates 717 and notches 711 engage recesses 701. The back plate 702 forms a vertically-erect rear wall that serves as a stopper to cap off the rear end of case 710. Back plate 702 can also be used as a positioning bar/block for customized housing design to hold EUSB device 101. LED 160 is housed inside cavity hole 703, and a LED window (not shown) on back plate 702 allows emitting light from LED 160 to indicate when EUSB device 101 is active (i.e., when LED 160 is lit) and inactive (when not lit).

Figure 26:
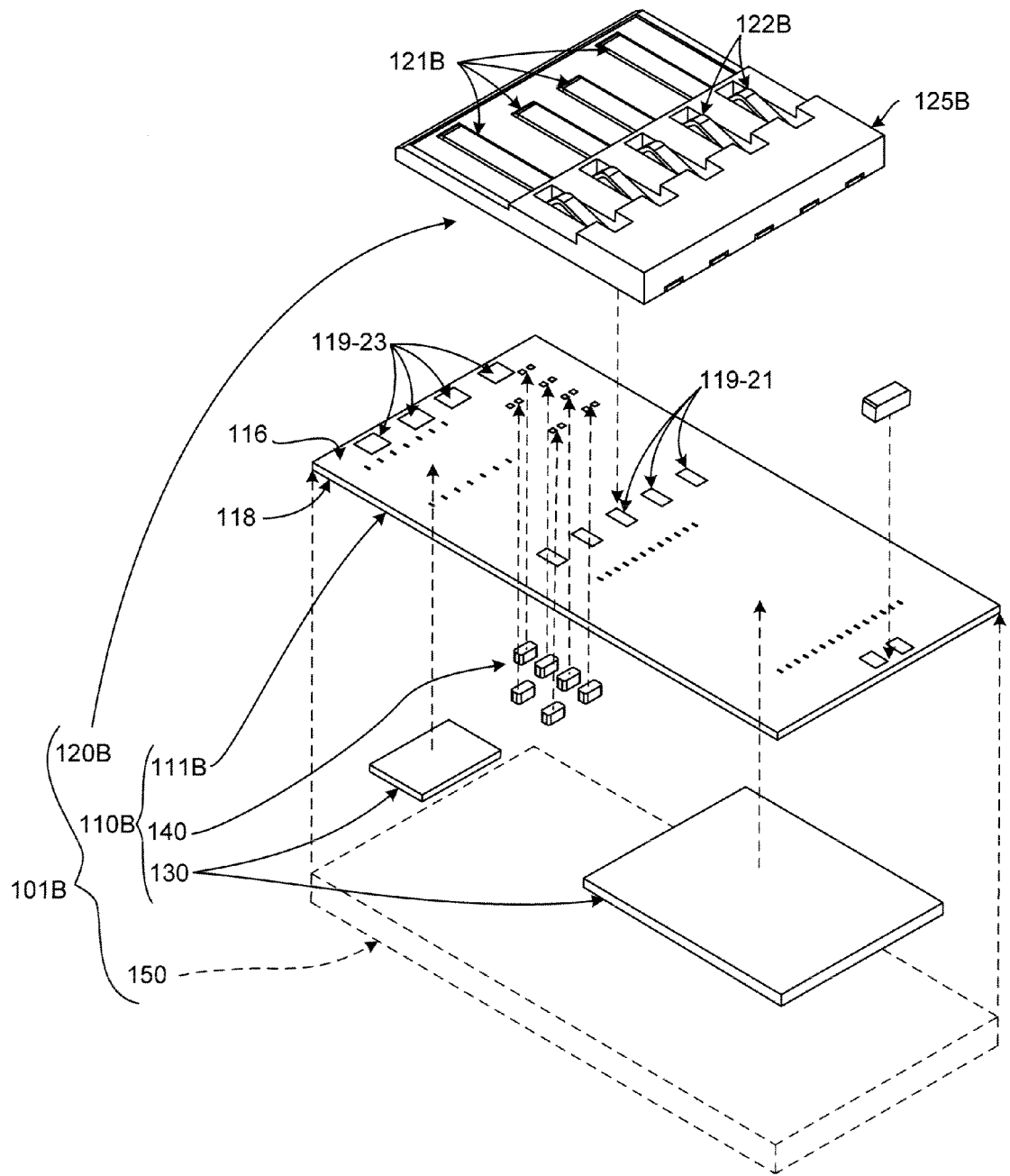
FIG. 26 is an exploded perspective view showing an EUSB device according to another embodiment of the present invention.

FIGS. 26-28 show an EUSB device 101B formed in accordance with another specific embodiment of the present invention. Referring to FIG. 26, similar to EUSB device 101A (described above), EUSB device 101B includes a PCBA 110B including a PCB 111B having an upper surface 116 and a lower surface 118, ICs 130 mounted on lower surface 118 using the Chip-On Board (COB) assembly technique described above, and several passive components 140 mounted on lower surface 118 using efficient SMT techniques. In addition, EUSB device 101B includes a spring assembly 120B onto which contact springs 122B are mounted and held for EUSB operations.

Referring to spring assembly 120B in FIG. 26, EUSB device 101B differs from the previous embodiment in that it includes a 9-pin spring guide block 125B formed by plastic molding methods that incorporates all nine contact springs (i.e., "standard" USB contact springs 121B and EUSB contact springs 122B). The base portions of contact springs 121B and 122B are exposed on a lower surface of guide block 125B to make contact with I/O contact pads 119-21 and 119-23, which are disposed on upper surface 116 of PCB 110B, and then known solder reflow techniques are utilized to connect base portions of springs to the contact pads. FIGS. 27(A) and 27(B) are exploded perspective and assembled perspective views showing 9-pin spring guide block 125B in additional detail, indicating that "standard" contact contact springs are disposed in corresponding front grooves 128 of guide block 125B, and EUSB contact springs 122B are disposed in corresponding rear grooves 129 of guide block 125B. FIG. 28 shows EUSB device 101B in the fully assembled state. The base portions of contact springs 121B and 122B are exposed on a lower surface of guide block 125B to make contact with the corresponding I/O contact pads (e.g., as shown in FIG. 28, base portions of contact springs 122B are shown in contact with I/O contact pads 119-21). Note that the assembly method associated with EUSB device 101B differs from that of EUSB device 101A (i.e., as indicated in FIG. 4) only in that PCBA 110B includes contact pads 119-23 instead of metal contacts 121, which are assembled and provided on spring assembly 120B. EUSB device 101B is otherwise analogous to EUSB device 101A.

Figure 29A:
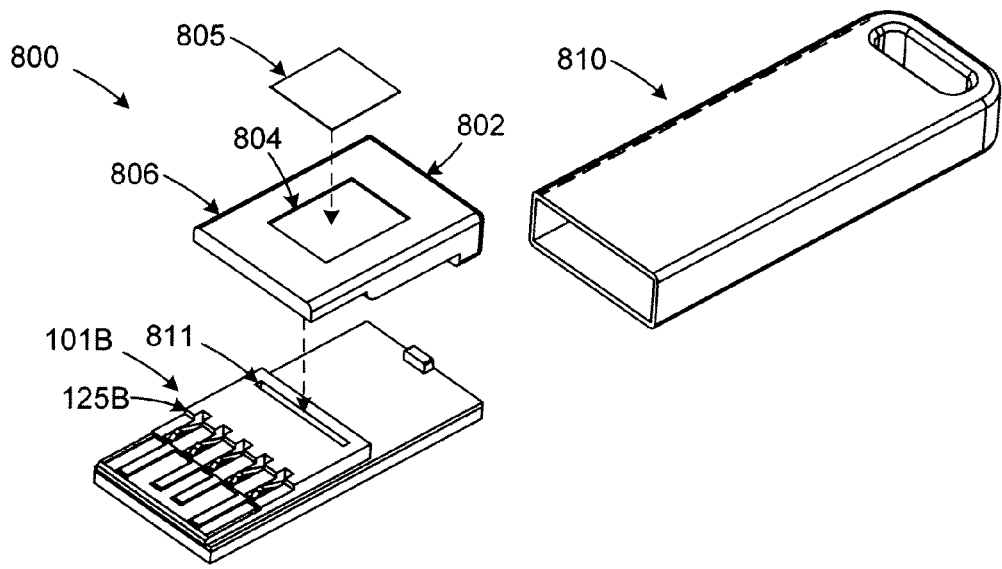
FIGS. 29(A), 29(B) and 29(C) are perspective views showing an EUSB assembly according to another embodiment of the present invention.
Figure 29B:
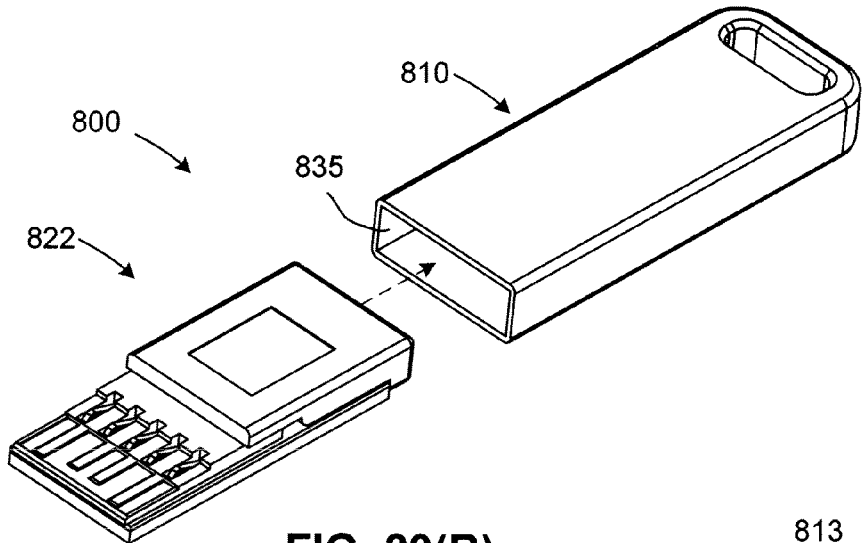
Figure 29C:
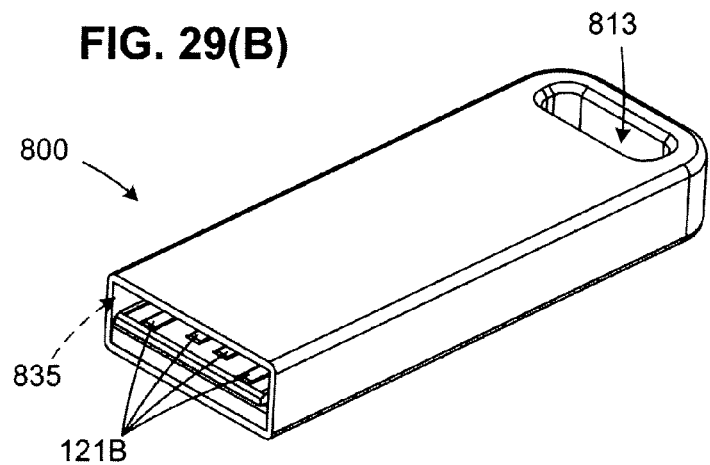
Figure 30A:
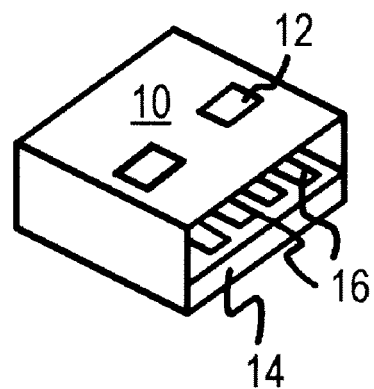
FIGS. 30(A) and 30(B) are front perspective views showing a conventional USB male plug and a conventional USB female socket, respectively.
Figure 30B:
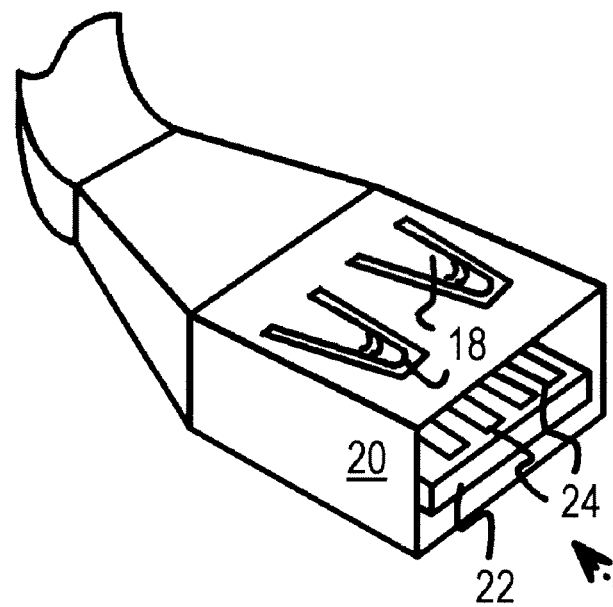

FIGS. 29(A) to 29(C) are exploded perspective and assembled perspective views, respectively, depicting an Extended Universal-Serial-Bus (EUSB) assembly 800 according to another specific embodiment that utilizes EUSB device 101B (substantially as described above) as a modular structure that is fixedly connected inside an external rectangular plastic or metal tube housing (case) 810 by way of a carrier structure 806 such that, as indicated in FIG. 29(C), metal contacts 121B of EUSB device 101B are accessible through a front opening 835 defined a standard USB plug shell 830 formed at a front end of case 810. Note that EUSB device 101B is modified from the structure described above to include a slot 811 formed in an upper surface of spring block 125B.

Referring to FIG. 29(A), holder 806 includes a downward-extending protrusion rib (not shown), a rectangular depression 804 for receiving a tape portion 805 (i.e., either thermal set adhesive tape or double-sided adhesive tape), and a rear block 803. Holder 806 is mounted onto a rear portion of EUSB device 101B and is fixed in place by snap coupling the protrusion rib into slot 811 (as indicated by the dashed-line arrow), thereby forming a EUSB card sub-assembly 822 (as shown in FIG. 29(B)). Rear block 802 of holder 806 fits against the back end of COB-EUSB device 101B and inside of tube metal housing 810. Next, the EUSB sub-assembly 822 is inserted into housing 810 through front opening 835 as indicated in FIG. 29(B), and securely located inside housing 810 with rear block 802 serving to stop EUSB device 101B, thereby forming completed USB assembly 800, as shown in FIG. 29(C). A keychain hole 813 is located at the rear section of shell 810 to provide a method of securing assembly 800 to a key or lanyard.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with specific reference to nine-pin extended USB devices, the present invention is also applicable to other EUSB devices, and using other extended USB communication systems (i.e., including a number of contact springs 122 other than five, as disclosed herein).

The invention claimed is:

1. An Extended Universal-Serial-Bus (EUSB) device comprising:
    a printed circuit board assembly (PCBA) including:
        a printed circuit board (PCB) having a peripheral edge including a front edge portion, the PCB having opposing first and second surfaces, and
        a plurality of metal input/output contact pads disposed on the first surface of the PCB;
    four standard USB contact pads disposed adjacent to the front edge portion of the PCB;
    at least one integrated circuit (IC) mounted on the second surface of the PCB;
    a single-shot molded housing comprising a plastic material that entirely covers the second surface of the PCB such that said at least one IC is encased by said single-shot molded housing, said housing being formed such that no portion of the plastic material is disposed on the first surface of the PCB; and
    a plurality of contact springs arranged in a row and disposed over the first surface such that the standard USB contact pads are disposed between the plurality of contact springs and the front edge portion of the PCB, wherein a base portion of each said contact spring is connected to an associated contact pad of the plurality of metal input/output contact pads, and wherein each said contact spring includes a curved contact portion that protrudes above the first surface of the PCB.

2. The EUSB device of claim 1, wherein each of the plurality of metal contact springs comprises a pair of base portions that are respectively soldered to the first surface of the PCB by way of corresponding input/output contact pads.

3. The EUSB device of claim 2, wherein each of the four standard USB contact pads are integrally formed on the first surface of the PCB.

4. The EUSB device of claim 2, further comprising a spring guide block secured to one base portion of each of the plurality of metal contact springs.

5. The EUSB device of claim 4, further comprising at least one passive component mounted on one of the first surface of the PCB and the second surface of the PCB, wherein the at least one passive component comprises at least one of a resistor, a capacitor, an oscillator, and a light emitting diode that is soldered to a corresponding contact pad disposed on said one of the first surface and the second surface of the PCB.

6. The EUSB device of claim 1, wherein each of the plurality of metal contact springs comprises a base portion that is soldered to the first surface of the PCB by way of corresponding input/output contact pads.

7. The EUSB device of claim 6, further comprising a spring guide block secured to each of the plurality of metal contact springs.

8. The EUSB device of claim 7, wherein each of the four standard USB contact pads is disposed on the spring guide block and is soldered to the first surface of the PCB by way of corresponding input/output contact pads.

9. The EUSB device of claim 4, further comprising at least one passive component mounted on one of the first surface of the PCB and the second surface of the PCB, wherein the at least one passive component comprises at least one of a resistor, a capacitor, an oscillator, and a light emitting diode that is soldered to a corresponding contact pad disposed on said one of the first surface and the second surface of the PCB.

10. An Extended Universal Serial Bus (EUSB) assembly comprising:
a tube-shaped housing having a plug shell section defining a front opening;
carrier substrate disposed inside said tube-shaped housing; and
a EUSB device disposed on the carrier substrate, said EUSB device including:
 a printed circuit board assembly (PCBA) including:
  a printed circuit board (PCB) having a peripheral edge including a front edge portion, the PCB having opposing first and second surfaces, and
  a plurality of metal input/output contact pads disposed on the first surface of the PCB;
 four standard USB contact pads disposed adjacent to the front edge portion of the PCB;
 at least one integrated circuit (IC) mounted on the second surface of the PCB;
 a single-shot molded housing comprising a plastic material that entirely covers the second surface of the PCB such that said at least one IC is encased by said single-shot molded housing, said housing being formed such that no portion of the plastic material is disposed on the first surface of the PCB; and
 a plurality of contact springs arranged in a row and disposed over the first surface such that the standard USB contact pads are disposed between the plurality of contact springs and the front edge portion of the PCB, wherein a base portion of each said contact spring is connected to an associated contact pad of the plurality of metal input/output contact pads, and wherein each said contact spring includes a curved contact portion that protrudes above the first surface of the PCB,
wherein said EUSB device is disposed inside the tube-shaped housing such that said four standard USB contact pads and said plurality of contact springs are accessible through said front opening by a host system when said plug shell section is operably connected to said host system.

11. The EUSB assembly of claim 10, further comprising:
a back plate and a U-block connected to said carrier substrate such that a rear section of said EUSB device is held against said carrier substrate by said U-block;
one of a thermal set adhesive tape portion or a double-sided adhesive tape portion disposed in a depression formed in said carrier substrate, wherein said EUSB device is held against said carrier substrate by said thermal tape portion.

12. The EUSB assembly of claim 10,
wherein the carrier substrate is mounted onto a rear portion of the EUSB device and is fixed in place by snap coupling, and
wherein assembly further comprises one of a thermal set adhesive tape portion or a double-sided adhesive tape portion disposed in a depression formed in said carrier substrate, said tape portion being positioned such that said carrier substrate is secured to an inside surface of said tube-shaped housing by said tape portion.

* * * * *